US010833069B2

(12) United States Patent
Zhang et al.

(10) Patent No.: US 10,833,069 B2
(45) Date of Patent: Nov. 10, 2020

(54) LOGIC GATE DESIGNS FOR 3D MONOLITHIC DIRECT STACKED VTFET

(71) Applicant: International Business Machines Corporation, Armonk, NY (US)

(72) Inventors: Chen Zhang, Guilderland, NY (US); Tenko Yamashita, Schenectady, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/455,665

(22) Filed: Jun. 27, 2019

(65) Prior Publication Data

US 2019/0326279 A1   Oct. 24, 2019

Related U.S. Application Data

(62) Division of application No. 15/879,181, filed on Jan. 24, 2018, now Pat. No. 10,381,346.

(51) Int. Cl.
| | |
|---|---|
| *H01L 27/06* | (2006.01) |
| *H01L 29/66* | (2006.01) |
| *H01L 29/10* | (2006.01) |
| *H01L 23/528* | (2006.01) |
| *H01L 21/8238* | (2006.01) |
| *H01L 21/822* | (2006.01) |

(Continued)

(52) U.S. Cl.
CPC ...... *H01L 27/0688* (2013.01); *H01L 21/2255* (2013.01); *H01L 21/8221* (2013.01); *H01L 21/823871* (2013.01); *H01L 21/823885* (2013.01); *H01L 21/84* (2013.01); *H01L 23/5286* (2013.01); *H01L 27/0207* (2013.01); *H01L 27/092* (2013.01); *H01L 27/1203* (2013.01); *H01L 29/0847* (2013.01); *H01L 29/1037* (2013.01); *H01L 29/6656* (2013.01); *H01L 29/66666* (2013.01); *H01L 29/7827* (2013.01); *H03K 19/0948* (2013.01); *H03K 19/20* (2013.01); *H03K 19/215* (2013.01)

(58) Field of Classification Search
None
See application file for complete search history.

(56) References Cited

U.S. PATENT DOCUMENTS

| | | | |
|---|---|---|---|
| 5,315,130 A | * | 5/1994 | Hively ............... G11C 5/025 |
| | | | 257/211 |
| 5,612,563 A | | 3/1997 | Fitch et al. |

(Continued)

OTHER PUBLICATIONS

List of IBM Patents or Applications Treated as Related (2 pages).

*Primary Examiner* — Herve-Louis Y Assouman
(74) *Attorney, Agent, or Firm* — Randall Bluestone; Michael J. Chang, LLC

(57) ABSTRACT

Logic gate designs (e.g., NAND, NOR, Inverter) for stacked VTFET designs are provided. In one aspect, a logic gate device is provided. The logic gate device includes: at least one top vertical transport field-effect transistor (VTFET1) sharing a fin with at least one bottom VTFET (VTFET2); a power rail connected to a power contact of the logic gate device; and a ground rail, adjacent to the power rail, connected to a ground contact of the logic gate device. A method of forming a logic gate device is also provided.

11 Claims, 22 Drawing Sheets

B-B' cross section of NAND

(51) Int. Cl.
    *H01L 29/78*     (2006.01)
    *H01L 29/786*     (2006.01)
    *H01L 27/092*     (2006.01)
    *H01L 29/08*     (2006.01)
    *H01L 21/84*     (2006.01)
    *H01L 21/225*     (2006.01)
    *H03K 19/0948*     (2006.01)
    *H01L 27/12*     (2006.01)
    *H01L 27/02*     (2006.01)
    *H03K 19/21*     (2006.01)
    *H03K 19/20*     (2006.01)

(56) References Cited

U.S. PATENT DOCUMENTS

| | | |
|---|---|---|
| 6,303,466 B1 | 10/2001 | Shimonishi et al. |
| 6,744,082 B1 | 6/2004 | Forbes et al. |
| 7,074,656 B2 | 7/2006 | Yeo et al. |
| 7,683,428 B2 | 3/2010 | Chidambarrao et al. |
| 9,177,890 B2 | 11/2015 | Du |
| 9,496,394 B2 | 11/2016 | Anderson et al. |
| 9,659,963 B2 | 5/2017 | Cheng et al. |
| 9,680,473 B1 | 6/2017 | Anderson et al. |
| 2015/0194427 A1* | 7/2015 | Sengupta ............ H01L 27/0886 257/401 |
| 2016/0043074 A1 | 2/2016 | Hurley et al. |
| 2016/0211264 A1 | 7/2016 | Peng |
| 2016/0240533 A1 | 8/2016 | Oxland |
| 2016/0380002 A1* | 12/2016 | Cheng ................ H01L 27/1211 257/347 |
| 2017/0025412 A1 | 1/2017 | Jun et al. |

\* cited by examiner

A-A' cross section of NAND    FIG. 19

A-A' cross section of NAND

A-A' cross section of NAND

B-B' cross section of NAND

B-B' cross section of NAND

B-B' cross section of NAND

LOGIC GATE DESIGNS FOR 3D MONOLITHIC DIRECT STACKED VTFET

CROSS-REFERENCE TO RELATED APPLICATIONS

This application is a divisional of U.S. application Ser. No. 15/879,181 filed on Jan. 24, 2018, now U.S. Pat. No. 10,381,346, the contents of which are incorporated by reference herein.

FIELD OF THE INVENTION

The present invention relates to vertical transport field effect transistor (VTFET) devices, and more particularly, to logic gate designs for stacked VTFET designs.

BACKGROUND OF THE INVENTION

Stacking field-effect transistors (FETs) in the vertical direction gives an additional dimension for complementary metal-oxide-semiconductor (CMOS) area scaling. However, it is very challenging to stack planar FETs.

Vertical field effect transistors (VFETs) however have a unique structure that can help the stacking process. Namely, as opposed to planar CMOS devices, VFETs are oriented with a vertical fin channel disposed on a bottom source/drain and a top source/drain disposed on the fin channel.

Logic gate designs (e.g., NAND, NOR, Inverter) in the scheme of direct stacking would be desirable.

SUMMARY OF THE INVENTION

The present invention provides logic gate designs (e.g., NAND, NOR, Inverter) for stacked VTFET designs. In one aspect of the invention, a logic gate device is provided. The logic gate device includes: at least one top vertical transport field-effect transistor (VTFET1) sharing a fin with at least one bottom VTFET (VTFET2); a power rail connected to a power contact of the logic gate device; and a ground rail, adjacent to the power rail, connected to a ground contact of the logic gate device.

In another aspect of the invention, a method of forming a logic gate device is provided. The method includes: patterning at least one first fin and at least one second fin in a wafer; forming a device stack alongside the first fin and the second fin, wherein the device stack includes a first top VTFET (VTFET1A) and a first bottom VTFET (VTFET2A) that share the first fin, and a second top VTFET (VTFET1B) and a second bottom VTFET (VTFET2B) that share the second fin, and wherein the device stack further includes a sacrificial layer; patterning the sacrificial layer to disconnect the sacrificial layer in between the first fin and the second fin; removing a first disconnected portion of the sacrificial layer and replacing the first disconnected portion of the sacrificial layer with contact metal to form a ground contact connected to top source and drains of the VTFET2A; and removing a second disconnected portion of the sacrificial layer and replacing the second disconnected portion of the sacrificial layer with the contact metal to form an output contact connected to top source and drains of the VTFET2B, wherein the ground contact and the output contact are disconnected from one another.

A more complete understanding of the present invention, as well as further features and advantages of the present invention, will be obtained by reference to the following detailed description and drawings.

DETAILED DESCRIPTION OF PREFERRED EMBODIMENTS

Three-dimensional (3D) monolithic direct stacked vertical transistor field effect transistors (VTFETs) are devices including an n-channel FET (NFET) and a p-channel FET (PFET) that share the same fin and as such the NFET and PFET are stacked directly on top of one another forming a monolithic design. Either the NFET or the PFET can be on the top or the bottom of the device stack. Thus, stacked VTFETs are contemplated herein having either an NFET stacked on top of a PFET, or a PFET stacked on top of an NFET.

Advantageously, provided herein are logic gate designs for stacked VTFET devices. Logic gates perform logic operations on binary inputs to derive a single output. A NAND gate, for instance, will output a logic 0 only if all of its inputs have a value of 1, otherwise the NAND gate will output a logic 1. A NOR gate will output a logic 1 only if all of its inputs have a value of 0, otherwise the NOR gate will output a logic 0. An inverter (a NOT gate) flips the input, i.e., input 1, output 0, or vice versa.

In a first exemplary embodiment, a stacked VTFET NAND gate design is described by way of reference to FIGS. 1-5. The NAND gate will be formed by a pair of stacked VTFETs, i.e., two top VTFETs and two bottom VTFETs. In this design, the top VTFETs will be connected in parallel and the two bottom VTFETs will be connected in series. As provided above, either the NFET or the PFET can be at the top/bottom of the VTFET stack. Thus, the pair of stacked VTFETs can include two top NFETs and two bottom PFETs, or two top PFETs and two bottom NFETs. A VTFET of the same polarity however is present at a given level in the stack. For instance, the top VTFETs in the pair of stacks are either both NFETs or both PFETs, while the bottom VTFETs in the pair of stacks are either both PFETs or both NFETs, respectively. Arbitrarily, the top VTFET in the stack will also be referred to herein as VTFET1 and the bottom VTFET in the stack will be referred to herein as VTFET2.

Figure 1:
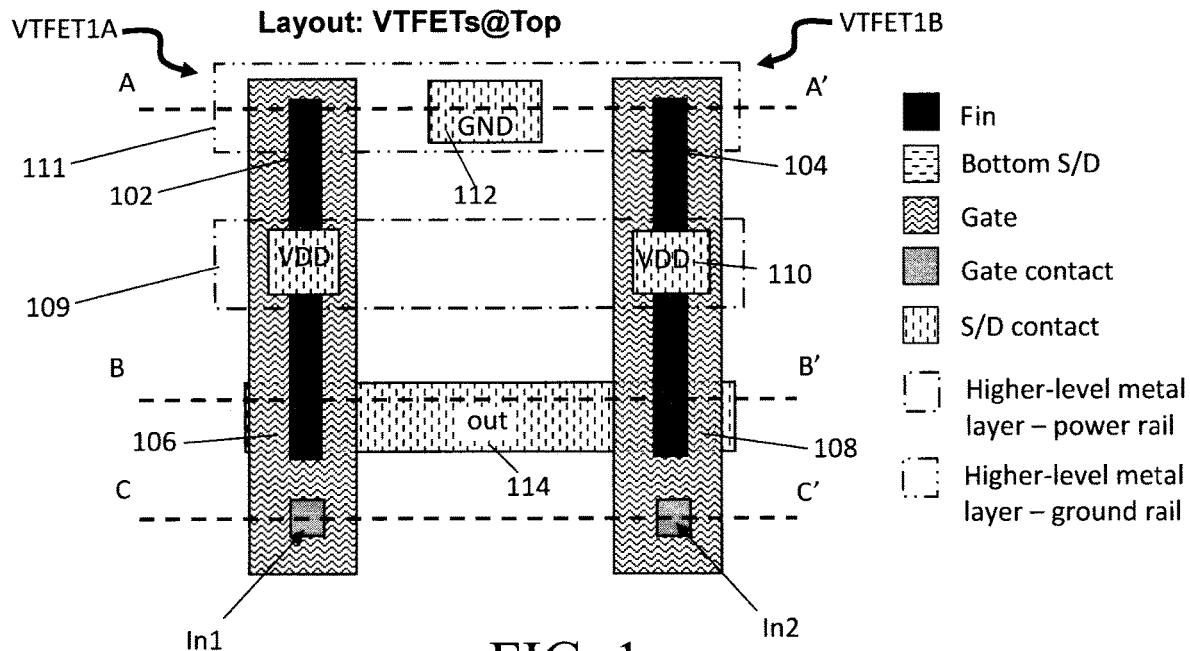
FIG. 1 is a top-down view of top vertical transport field-effect transistors (VTFETs) of an exemplary NAND gate layout according to an embodiment of the present invention.

FIG. 1 depicts a top-down view of the top VTFETs (i.e., (first) VTFET1A on the left and (second) VTFET1B on the right) of the NAND gate layout. As shown in FIG. 1, the top VTFETs are located at the tops of two adjacent fins 102 and 104. Gates 106 and 108 of the top VTFETs are present alongside the fins 102 and 104, respectively. The top VTFETs are interconnected by a power rail 109, which is a higher-level metal layer connected to power (VDD) contacts 110. A ground rail 111 (a higher-level metal layer connected to ground (GND) contacts 112) is present adjacent to the power rail 109. An output contact 114 connects the top VTFETs to one of the bottom VTFETs (see below). Input to the NAND gate is provided via contacts In1 and In2 to the gates 106 and 108, respectively. Several different cross-sectional cuts through lines A-A', B-B', and C-C' of the NAND gate will be provided by way of reference to FIG. 3, FIG. 4, and FIG. 5, respectively.

Figure 2:
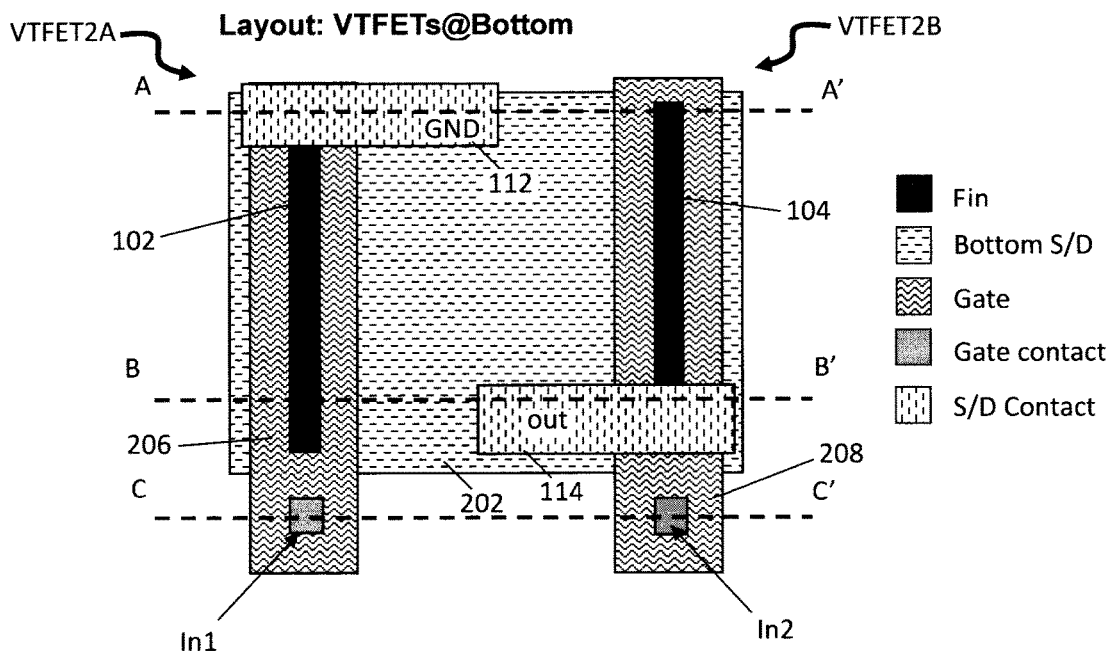
FIG. 2 is a top-down view of bottom VTFETs of the NAND gate layout according to an embodiment of the present invention.

FIG. 2 depicts a top-down view of the bottom VTFETs (i.e., (first) VTFET2A on the left and (second) VTFET2B on the right) of the NAND gate layout. As shown in FIG. 2, the bottom VTFETs are located at the bottoms of the fins 102 and 104. Gates 206 and 208 of the bottom VTFETs are present alongside the fins 102 and 104, respectively, above bottom source and drains 202. The ground contact 112 is connected to VTFET2A. The output contact 114 is connected to VTFET2B. Input to the NAND gate is provided via the contacts In1 and In2 to the gates 206 and 208, respectively.

Figure 3:
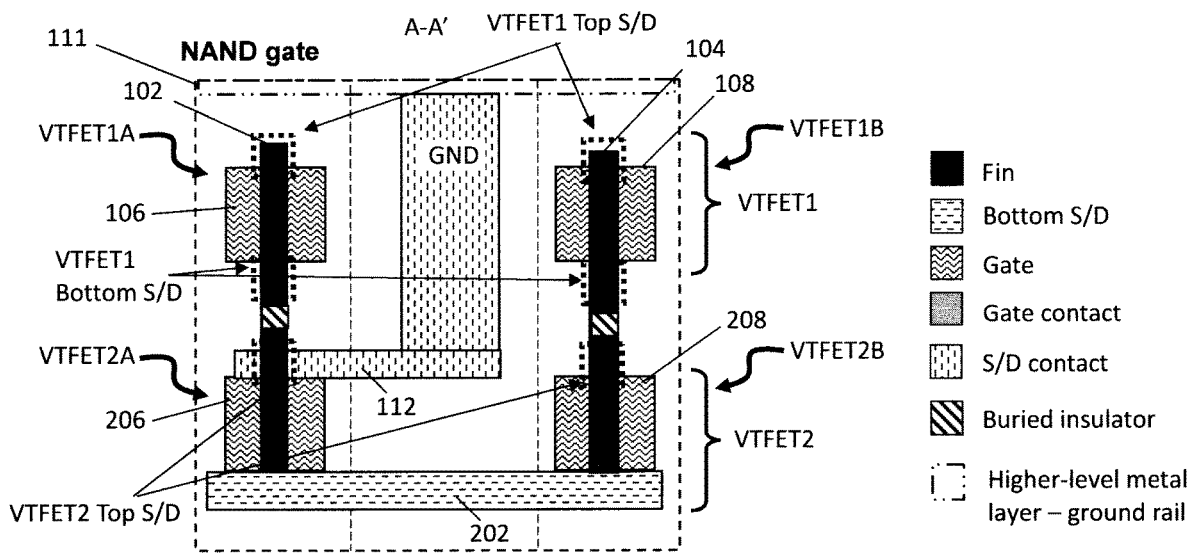
FIG. 3 is a cross-sectional view of the NAND gate layout of FIG. 1 and FIG. 2 through a ground contact according to an embodiment of the present invention.

FIG. 3 is a diagram illustrating a cross-sectional cut through line A-A' of FIG. 1 and FIG. 2. As shown in FIG. 3, the top VTFETs (VFET1A and VTFET1B) share a fin 102 and 104 with the bottom VTFETs (VTFET2A and VTFET2B), respectively. The tops and bottoms of the fins 102 and 104 are isolated from one another by a buried insulator (described in further detail below).

Gates 106 and 108 of the top VTFETs (VFET1A and VTFET1B) are present alongside fins 102 and 104, respectively. Gates 206 and 208 of the bottom VTFETs (VTFET2A and VTFET2B) are present alongside fins 102 and 104, respectively. As will be described in further detail below, each of the VTFETs has bottom and top source and drains (i.e., bottom/top S/D) below and above the respective gates. Thus, for instance, as shown in FIG. 3, the bottom source and drains 202 (common to both VTFET2A and VTFET2B) are present below gates 206 and 208, and the respective top source and drains (VTFET2 top S/D) are present above the gates 206 and 208. Similarly, bottom source and drains (VTFET1 bottom S/D) are present below gates 106 and 108, and the respective top source and drains (VTFET1 top S/D) are present above the gates 106 and 108. Notably, as shown in FIG. 3 the ground contact 112 is connected to the top source and drains (VTFET2 top S/D) of the bottom VTFET2A.

Figure 4:
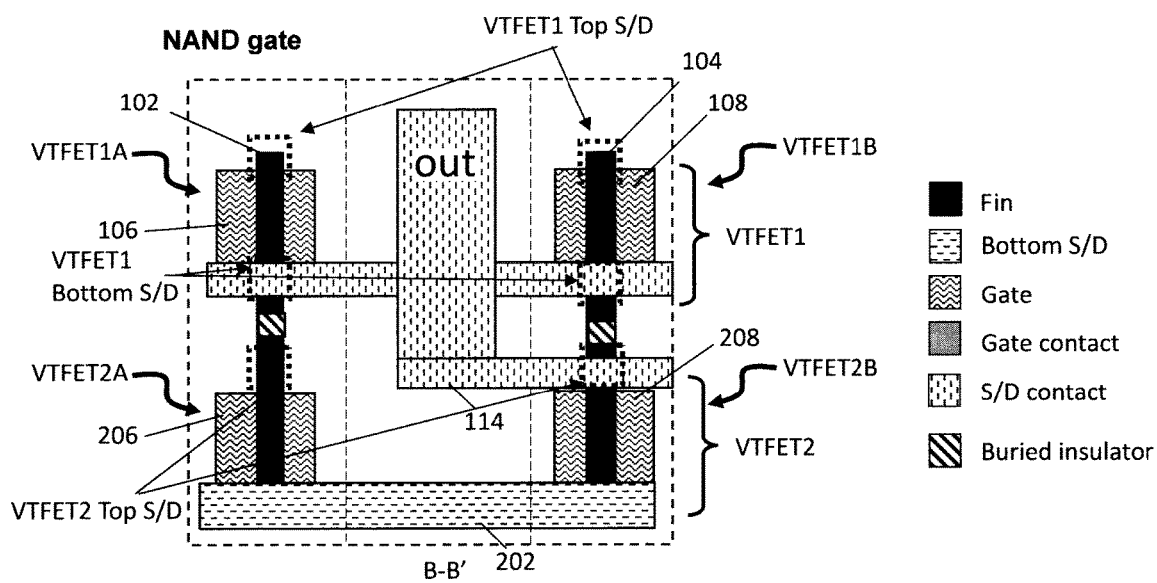
FIG. 4 is a cross-sectional view of the NAND gate layout of FIG. 1 and FIG. 2 through an output contact according to an embodiment of the present invention.

FIG. 4 is a diagram illustrating a cross-sectional cut through line B-B' of FIG. 1 and FIG. 2. As shown in FIG. 4, the output contact 114 is connected to the bottom source and drains (VTFET1 bottom S/D) of the top VTFET1A and the VTFET1B, and to the top source and drains (VTFET2 top S/D) of the bottom VTFET2B.

Figure 5:
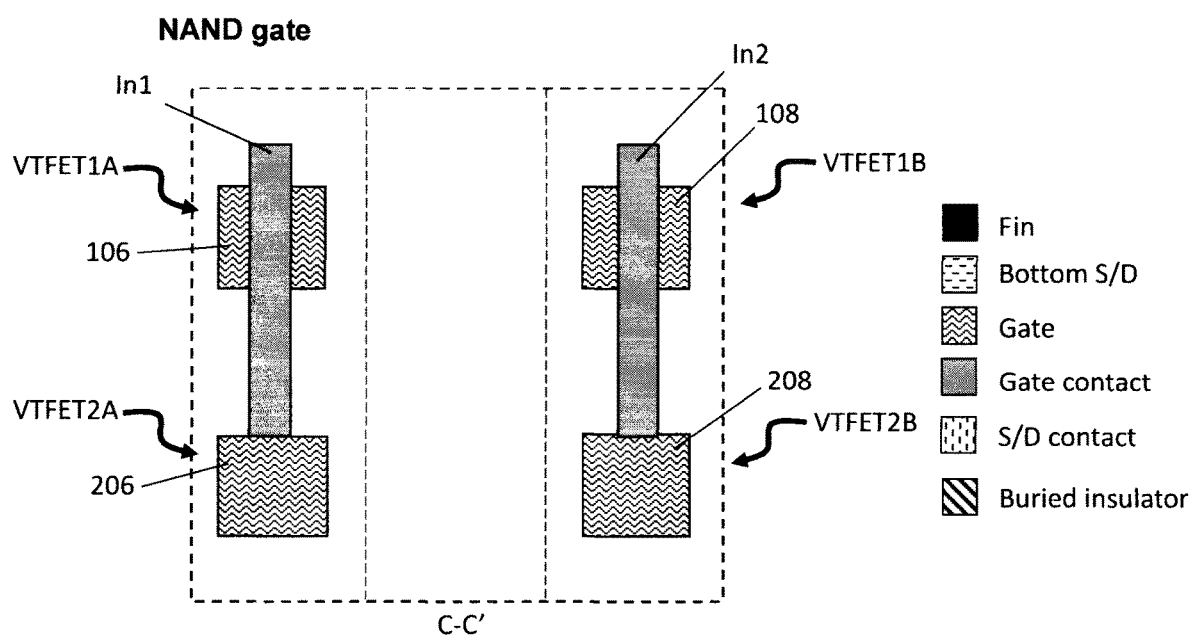
FIG. 5 is a cross-sectional view of the NAND gate layout of FIG. 1 and FIG. 2 through input contacts according to an embodiment of the present invention.

FIG. 5 is a diagram illustrating a cross-sectional cut through line C-C' of FIG. 1 and FIG. 2. As shown in FIG. 5, the contacts In1 and In2 are common to the gates 106 and 108 of the top VTFETs (VTFET1A and VTFET1B) and gates 206 and 208 of the bottom VTFETs (VTFET2A and VTFET2B), respectively.

In another exemplary embodiment, a stacked VTFET NOR gate design is described by way of reference to FIGS. 6-11. Like with the NAND gate, the NOR gate will be formed by a pair of stacked VTFETs, i.e., two top VTFETs and two bottom VTFETs. In this design, the top VTFETs will be connected in series and the two bottom VTFETs will be connected in parallel. As provided above, either the NFET or the PFET can be at the top/bottom of the VTFET stack. Thus, the pair of stacked VTFETs can include two top NFETs and two bottom PFETs, or two top PFETs and two bottom NFETs. A VTFET of the same polarity however is present at a given level in the stack. For instance, the top VTFETs in the pair of stacks are either both NFETs or both PFETs, while the bottom VTFETs in the pair of stacks are either both PFETs or both NFETs, respectively. Arbitrarily, the top VTFET in the stack will also be referred to herein as VTFET1 and the bottom VTFET in the stack will be referred to herein as VTFET2.

Figure 6:
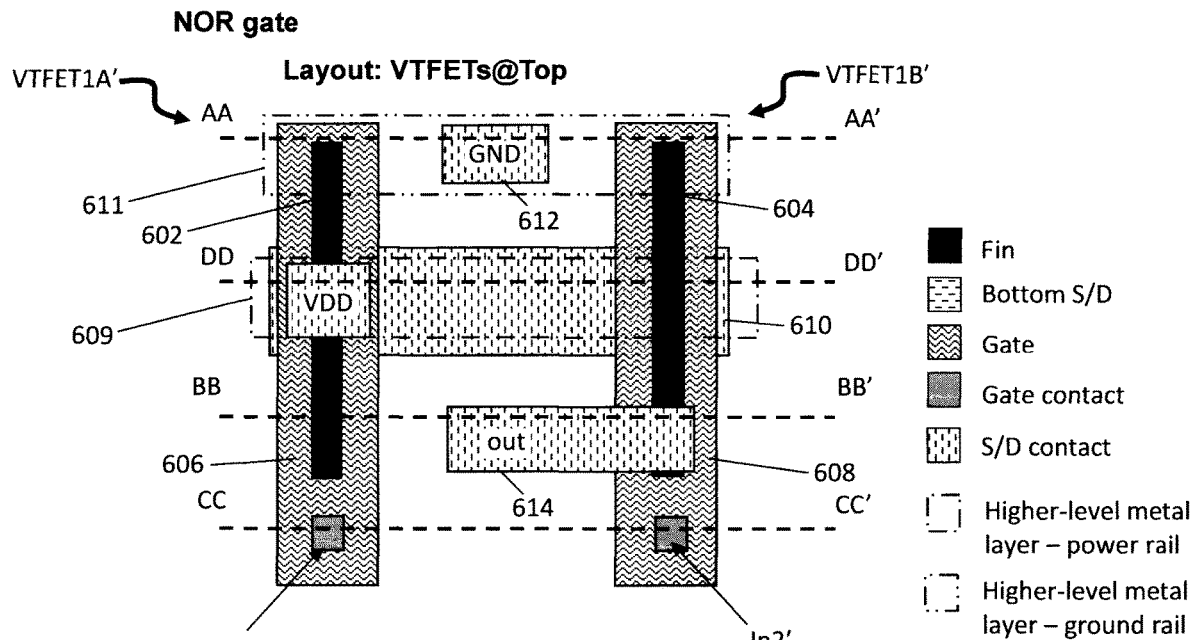
FIG. 6 is a top-down view of top VTFETs of an exemplary NOR gate layout according to an embodiment of the present invention.

FIG. 6 depicts a top-down view of the top VTFETs (i.e., (first) VTFET1A' on the left and (second) VTFET1B' on the right) of the NOR gate layout. As shown in FIG. 6, the top VTFETs are located at the tops of two adjacent fins 602 and 604. Gates 606 and 608 of the top VTFETs are present alongside the fins 602 and 604, respectively. A power rail 609 (which is a higher-level metal layer) is connected to the VTFET1A' and VTFET1B' through power (VDD) contact 610. A ground rail 611 (a higher-level metal layer connected to ground (GND) contacts 612) is present adjacent to the power rail 609. An output contact 614 is connected to the VTFET2A', VTFET1B' and VTFET2B'—see below. Input to the NOR gate is provided via contacts In1' and In2' to the gates 606 and 608, respectively. Several different cross-sectional cuts through lines AA-AA', BB-BB', CC-CC' and DD-DD' of the NOR gate will be provided by way of reference to FIG. 8, FIG. 9, FIG. 10 and FIG. 11, respectively.

Figure 7:
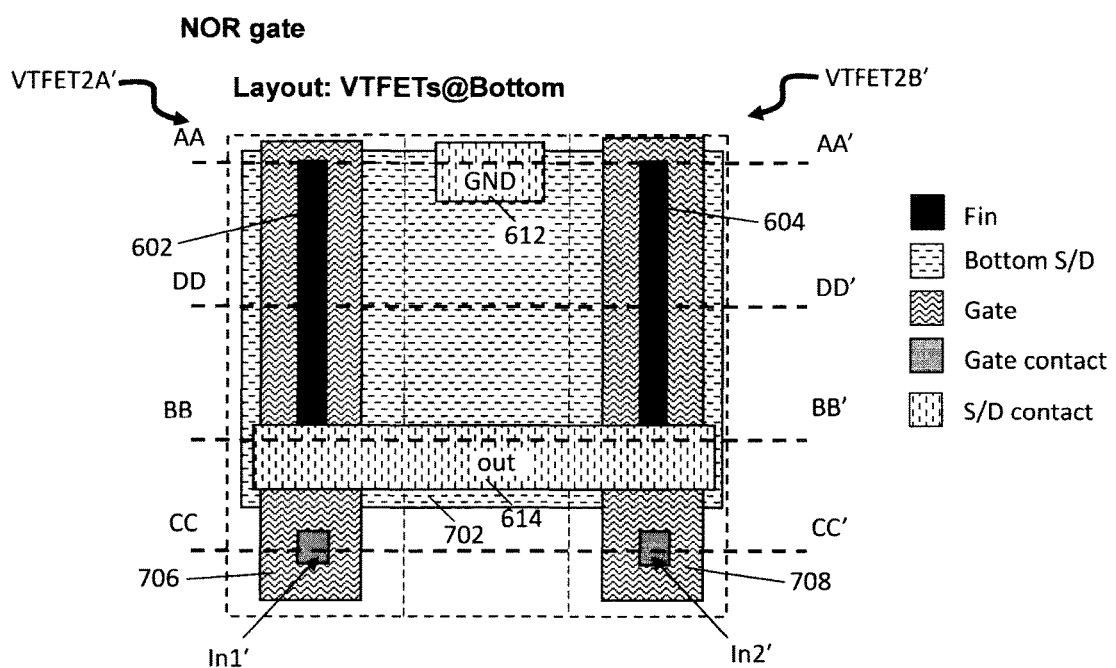
FIG. 7 is a top-down view of bottom VTFETs of the NOR gate layout according to an embodiment of the present invention.

FIG. 7 depicts a top-down view of the bottom VTFETs (i.e., (first) VTFET2A' on the left and (second) VTFET2B' on the right) of the NOR gate layout. As shown in FIG. 7, the bottom VTFETs are located at the bottoms of the fins 602 and 604. Gates 706 and 708 of the bottom VTFETs are present alongside the fins 602 and 604, respectively, above bottom source and drains 702. The ground contact 612 is connected to the bottom source and drains 702 (i.e., the bottom source and drains 702 are connected to ground). The output contact 614 is connected to VTFET2A' and VTFET2B'. Input to the NOR gate is provided via contacts In1' and In2' to the gates 706 and 708, respectively.

Figure 8:
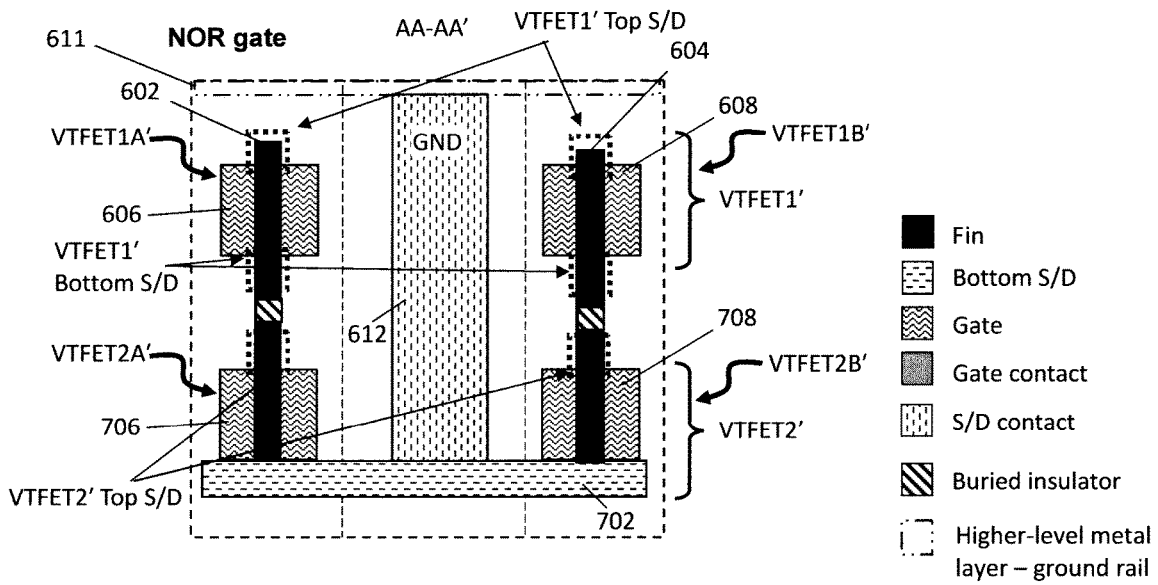
FIG. 8 is a cross-sectional view of the NOR gate layout of FIG. 6 and FIG. 7 through a ground contact according to an embodiment of the present invention.

FIG. 8 is a diagram illustrating a cross-sectional cut through line AA-AA' of FIG. 6 and FIG. 7. As shown in FIG. 8, the top VTFETs (VFET1A' and VTFET1B') share a fin 602 and 604 with the bottom VTFETs (VTFET2A' and VTFET2B'), respectively. The tops and bottoms of the fins 602 and 604 are isolated from one another by a buried insulator (described in further detail below).

Gates 606 and 608 of the top VTFETs (VFET1A' and VTFET1B') are present alongside fins 602 and 604, respectively. Gates 706 and 708 of the bottom VTFETs (VTFET2A' and VTFET2B') are present alongside fins 602 and 604, respectively. Each of the VTFETs has bottom and top source and drains (i.e., bottom/top S/D) below and above the respective gates. Thus, for instance, as shown in FIG. 8, the bottom source and drains 702 (common to both VTFET2A' and VTFET2B') are present below gates 706 and 708, and the respective top source and drains (VTFET2' top S/D) are present above the gates 706 and 708. Similarly, bottom source and drains (VTFET1' bottom S/D) are present below gates 606 and 608, and the respective top source and drains (VTFET1' top S/D) are present above the gates 606 and 608. Notably, as shown in FIG. 8 the ground rail 612 is present between the fins 602 and 604 and is connected directly to the bottom source and drains 702 (i.e., the bottom source and drains 702 are connected directly to ground).

Figure 9:
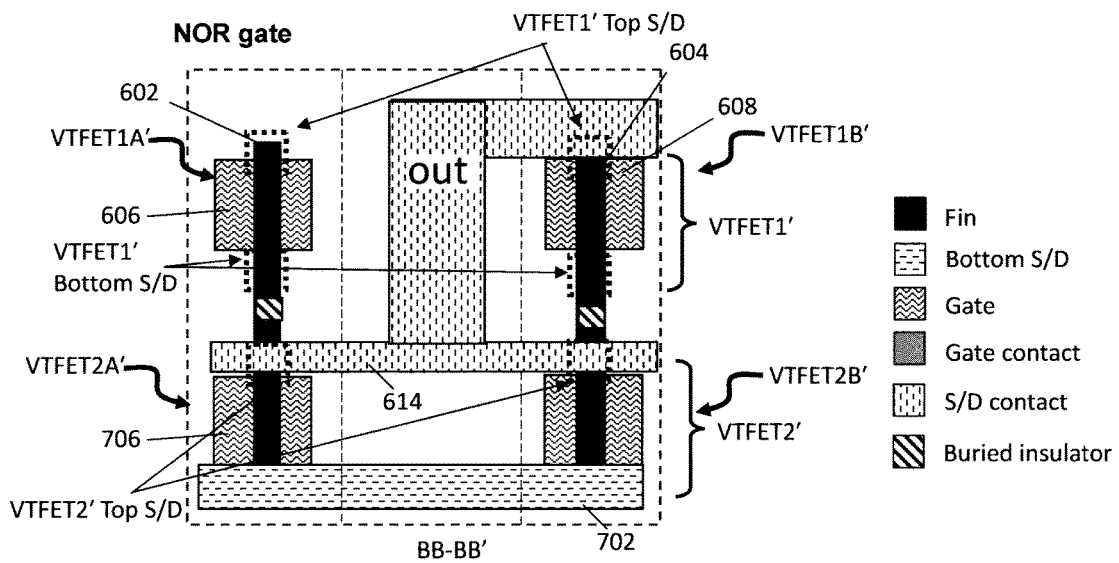
FIG. 9 is a cross-sectional view of the NOR gate layout of FIG. 6 and FIG. 7 through an output contact according to an embodiment of the present invention.

FIG. 9 is a diagram illustrating a cross-sectional cut through line BB-BB' of FIG. 6 and FIG. 7. As shown in FIG. 9, the output contact 614 is connected to the top source and drains (VTFET2' top S/D) of the bottom VTFET2A' and the VTFET2B', and to the top source and drains (VTFET1' top S/D) of the top VTFET1B'.

Figure 10:
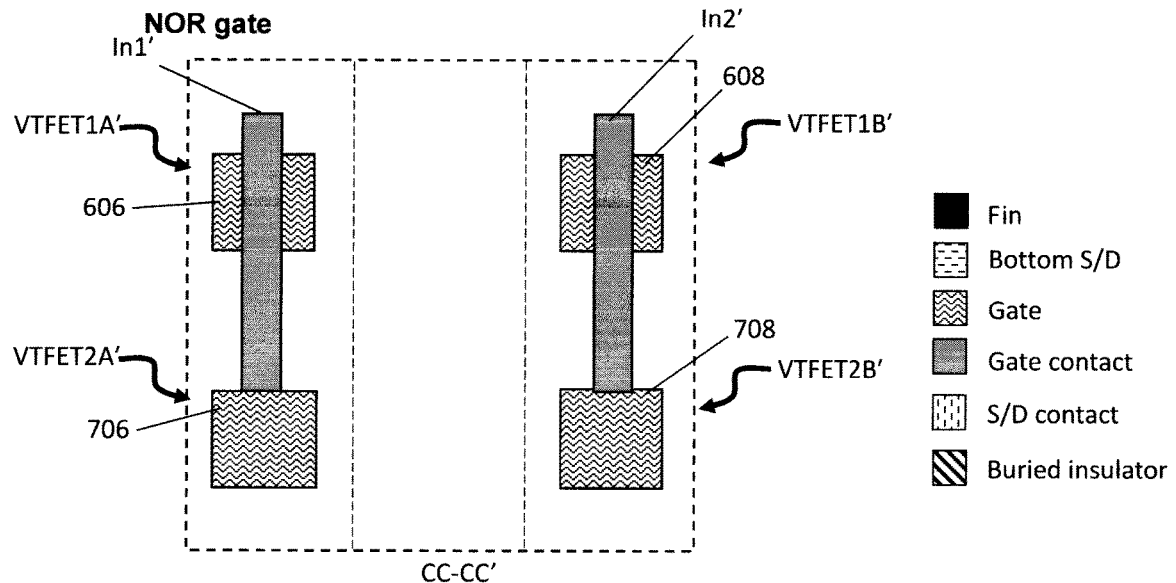
FIG. 10 is a cross-sectional view of the NOR gate layout of FIG. 1 and FIG. 2 through input contacts according to an embodiment of the present invention.

FIG. 10 is a diagram illustrating a cross-sectional cut through line CC-CC' of FIG. 6 and FIG. 7. As shown in FIG. 10, the contacts In1' and In2' are common to the gates 606 and 608 of the top VTFETs (VTFET1A' and VTFET1B') and gates 706 and 708 of the bottom VTFETs (VTFET2A' and VTFET2B'), respectively.

Figure 11:
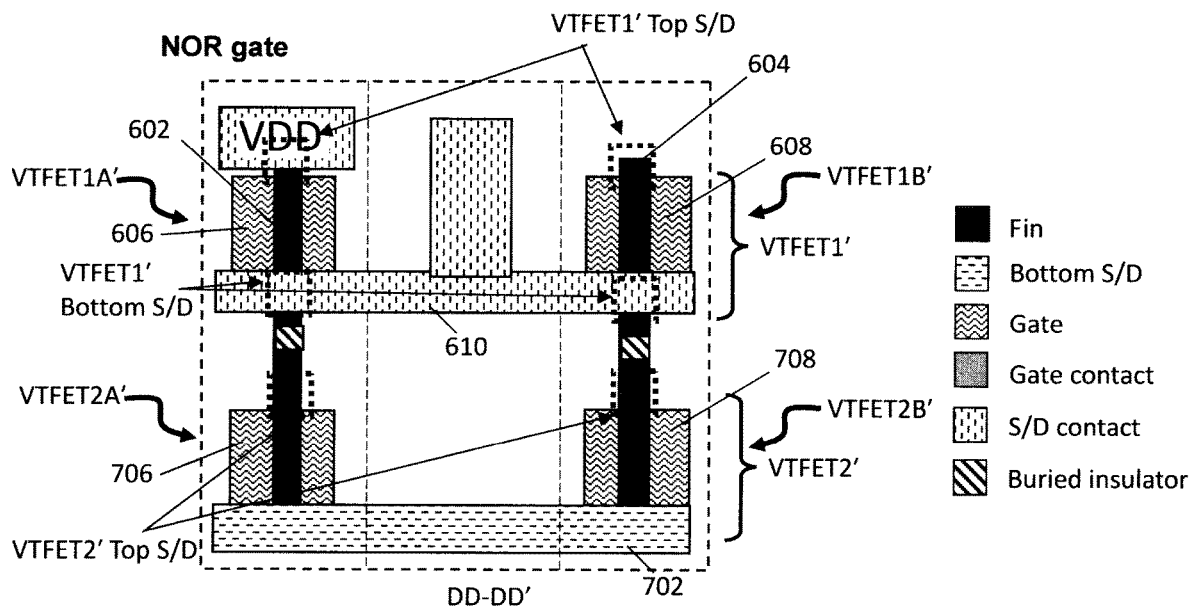
FIG. 11 is a cross-sectional view of the NOR gate layout of FIG. 1 and FIG. 2 through a power contact according to an embodiment of the present invention.

FIG. 11 is a diagram illustrating a cross-sectional cut through line DD-DD' of FIG. 6 and FIG. 7. As shown in FIG. 11, the VDD contact 610 is connected to the bottom source and drains (VTFET' bottom S/D) of the top VTFET1A' and the VTFET1B', and to the top source and drains (VTFET1' top S/D) of the top VTFET1A'.

In yet another exemplary embodiment, a stacked VTFET inverter (NOT gate) design is described by way of reference to FIGS. 12-16. The inverter will be formed by a single stacked VTFET, i.e., one top VTFET and one bottom VTFET. As provided above, either the NFET or the PFET can be at the top/bottom of the VTFET stack. Thus, the inverter stack can include a top NFET and a bottom PFET, or a top PFET and a bottom NFET. Arbitrarily, the top VTFET in the stack will also be referred to herein as VTFET1" and the bottom VTFET in the stack will be referred to herein as VTFET2".

Figure 12:
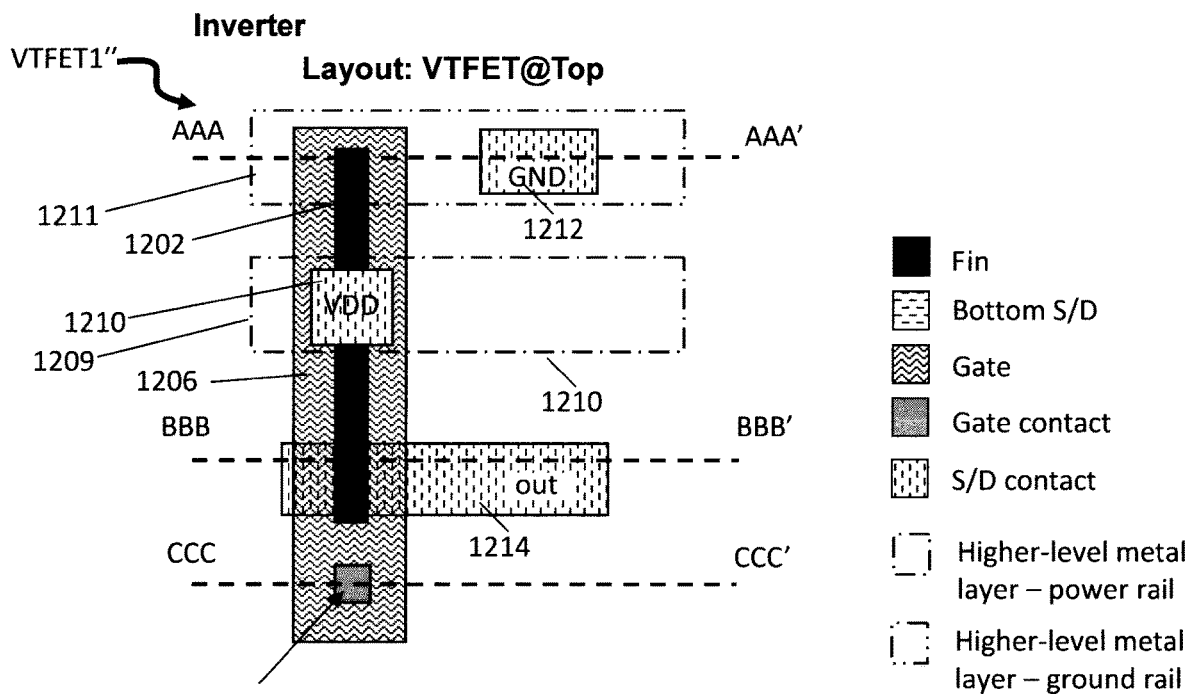
FIG. 12 is a top-down view of a top VTFET of an exemplary Inverter (NOT gate) layout according to an embodiment of the present invention.

FIG. 12 depicts a top-down view of the top VTFET (i.e., VTFET1") of the inverter layout. As shown in FIG. 12, the top VTFET is located at the top of a fin 1202. A gate 1206 of the top VTFET is present alongside the fin 1202. A power rail 1209 (which is a higher-level metal layer) is connected to the VTFET1" through power (VDD) contact 1210. A ground rail 1211 (a higher-level metal layer connected to ground (GND) contacts 1212) is present adjacent to the power rail 1209. An output contact 1214 is present adjacent to the power contact 1210. Input to the inverter is provided via contact In1" to the gate 1206. Several different cross-sectional cuts through lines AAA-AAA', BBB-BBB', and CCC-CCC' of the inverter gate will be provided by way of reference to FIG. 14, FIG. 15 and FIG. 16, respectively.

Figure 13:
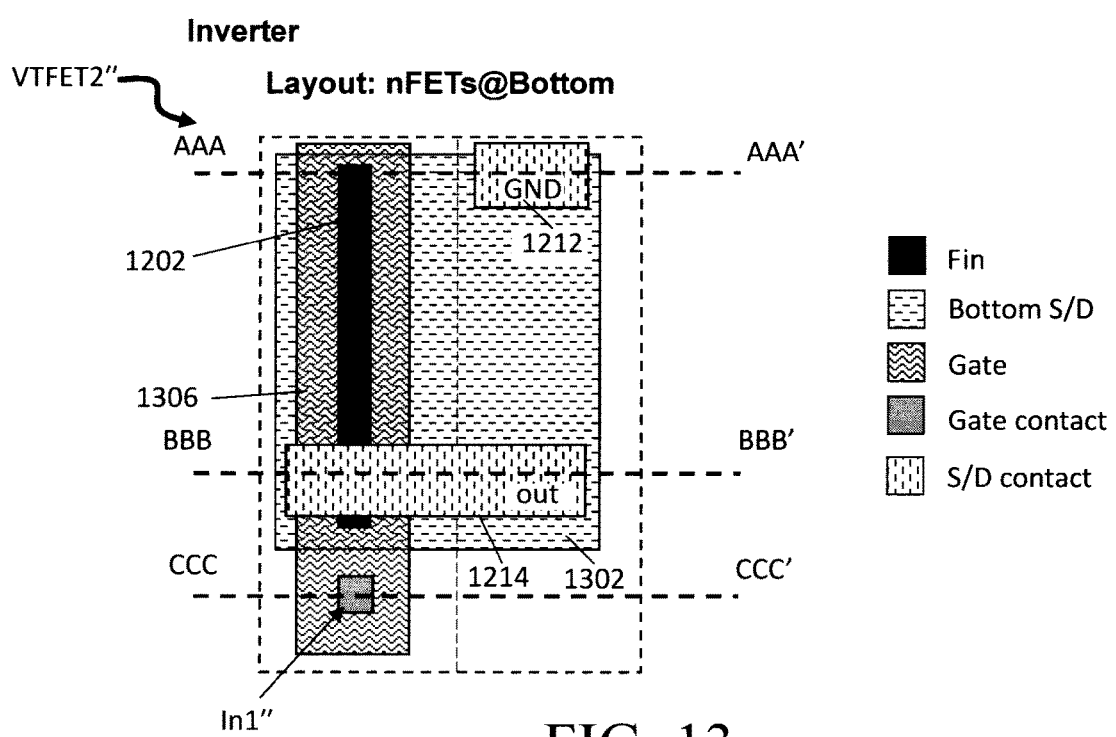
FIG. 13 is a top-down view of a bottom VTFET of the Inverter layout according to an embodiment of the present invention.

FIG. 13 depicts a top-down view of the bottom VTFET (i.e., VTFET2") of the inverter layout. As shown in FIG. 13, the bottom VTFET is located at the bottom of the fin 1202. A gate 1306 of the bottom VTFET is present alongside the fin 1202 above bottom source and drains 1302. The ground contact 1212 is connected to the bottom source and drains 1302 (i.e., the bottom source and drains 1302 are connected to ground). The output contact 1214 is connected to VTFET2" (and to the VTFET1"—see below). Input to the inverter is provided via contact In1" to the gate 1306.

Figure 14:
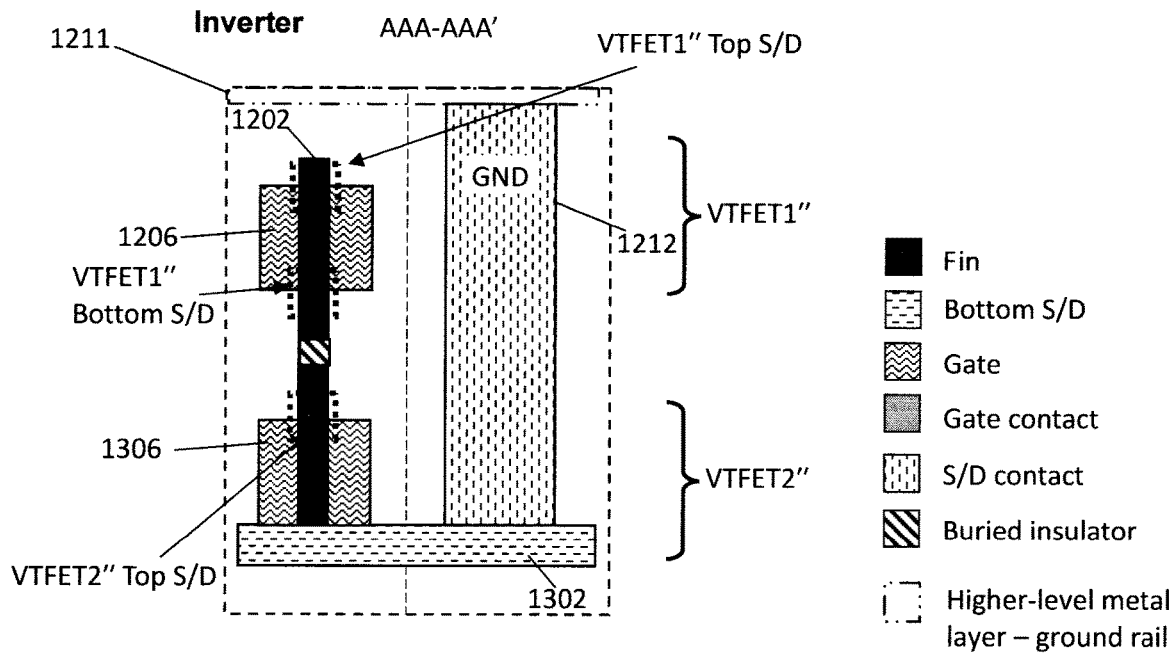
FIG. 14 is a cross-sectional view of the Inverter layout of FIG. 12 and FIG. 13 through a ground contact according to an embodiment of the present invention.

FIG. 14 is a diagram illustrating a cross-sectional cut through line AAA-AAA' of FIG. 12 and FIG. 13. As shown in FIG. 14, the top VTFET (VTFET1") shares a fin 1202 with the bottom VTFET (VTFET2"). The tops and bottoms of the fin 1202 are isolated from one another by a buried insulator.

Gates 1206 and 1306 of the top VTFET (VFET1") and bottom VTFET (VTFET2"), respectively, are present alongside the fin 1202. Each of the VTFETs has bottom and top source and drains (i.e., bottom/top S/D) below and above the respective gates. Thus, for instance, as shown in FIG. 14, the bottom source and drains 1302 are present below gate 1306, and the respective top source and drains (VTFET2" top S/D) are present above the gate 1306. Similarly, bottom source and drains (VTFET1" bottom S/D) are present below gate 1206, and the respective top source and drains (VTFET1" top S/D) are present above the gate 1206. Notably, as shown in FIG. 14 the ground contact 1212 is present adjacent to the fin 1202 and is connected directly to the bottom source and drains 1302 (i.e., the bottom source and drains 1302 are connected directly to ground).

Figure 15:
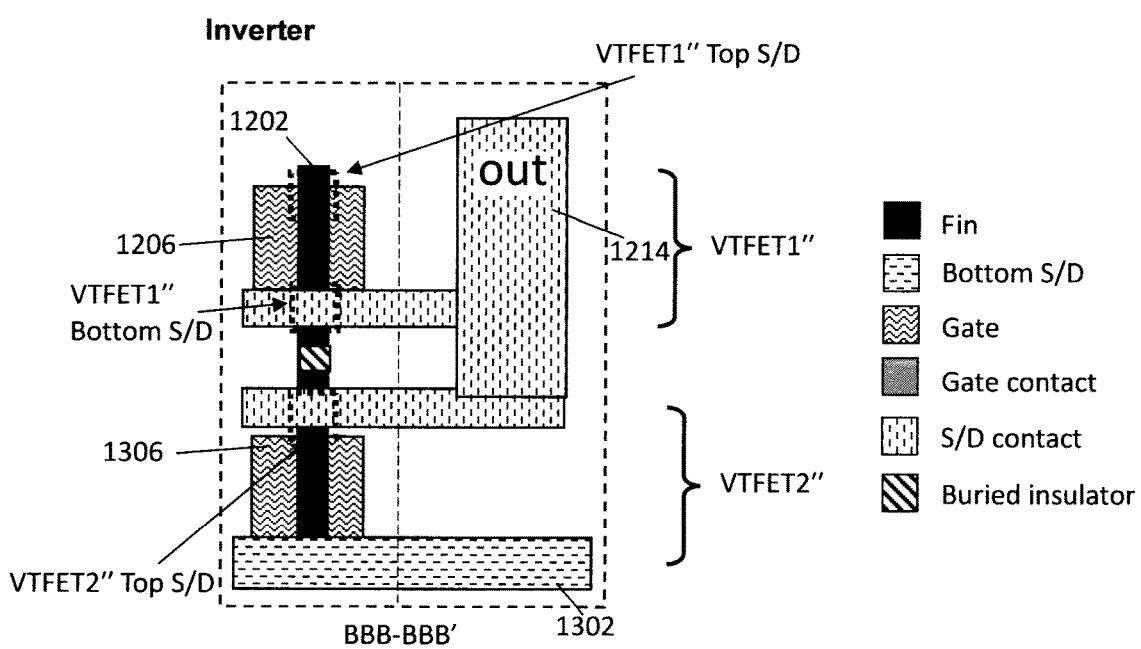
FIG. 15 is a cross-sectional view of the Inverter layout of FIG. 12 and FIG. 13 through an output contact according to an embodiment of the present invention.

FIG. 15 is a diagram illustrating a cross-sectional cut through line BBB-BBB' of FIG. 12 and FIG. 13. As shown in FIG. 15, the output contact 1214 is connected to the top source and drains (VTFET2" top S/D) of the bottom VTFET2", and to the bottom source and drains (VTFET1" bottom S/D) of the top VTFET1".

Figure 16:
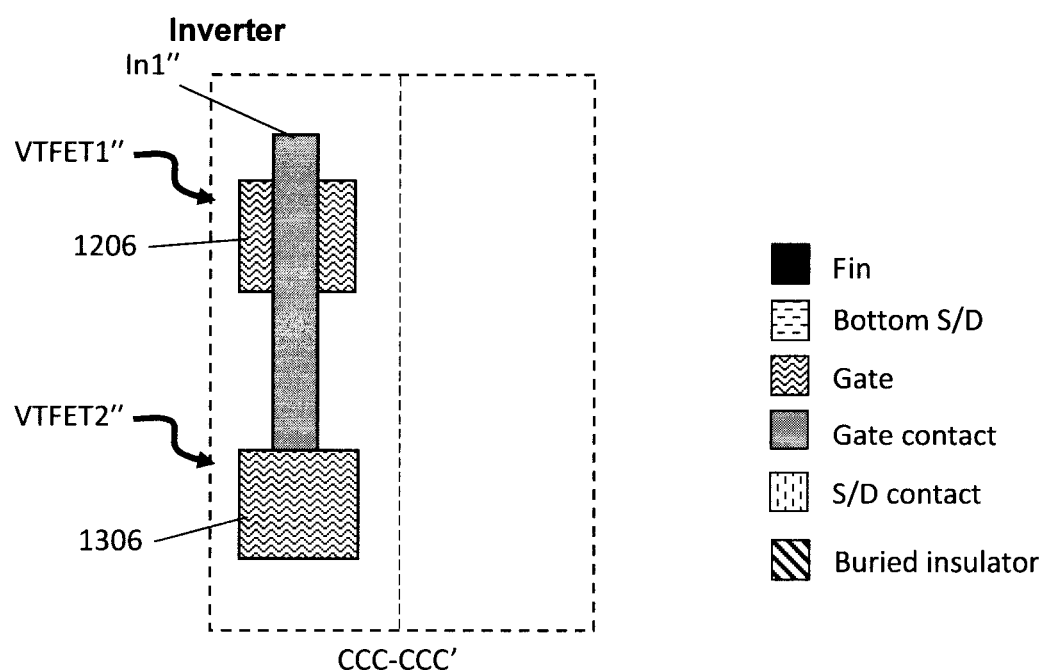
FIG. 16 is a cross-sectional view of the Inverter layout of FIG. 12 and FIG. 13 through an input contact according to an embodiment of the present invention.

FIG. 16 is a diagram illustrating a cross-sectional cut through line CCC-CCC' of FIG. 12 and FIG. 13. As shown in FIG. 16, the contact In1" is common to the gates 1206 and 1306 of the top and bottom VTFETs (VTFET1" and VTFET2", respectively).

An exemplary embodiment for forming a logic gate device in accordance with the present techniques is now described by way of reference to FIGS. 17-30. In the example that follows, source and drain doping will be achieved using dopant source layers placed at specific points alongside the fins. A drive-in anneal is then used to drive dopants from the dopant source layers into the fins.

The particular dopant source layer used will vary depending on whether the respective VTFET being formed is an NFET or a PFET. For instance, with an NFET, the dopant source layer includes a p-type dopant. Alternatively, with a PFET, the dopant source layer includes an n-type dopant. According to an exemplary embodiment, the dopant source layers employed are boron-doped glass (BSG) as a p-type dopant source and phosphorous-doped glass (PSG) as an n-type dopant source. Techniques for forming a stacked VTFET device using PSG and BSG for source and drain doping is described, for example, in U.S. patent application Ser. No. 15/858,267, entitled "Stacked Vertical NFET and PFET," filed on Dec. 29, 2017, the contents of which are incorporated by reference as if fully set forth herein.

Advantageously, once the dopant source layer has been used for source and drain doping, it can be removed and replaced with a contact metal. The positioning of the dopant source layer in the device stack places the contact (formed in its place) at the proper location for accessing the source and drain.

Figure 17:
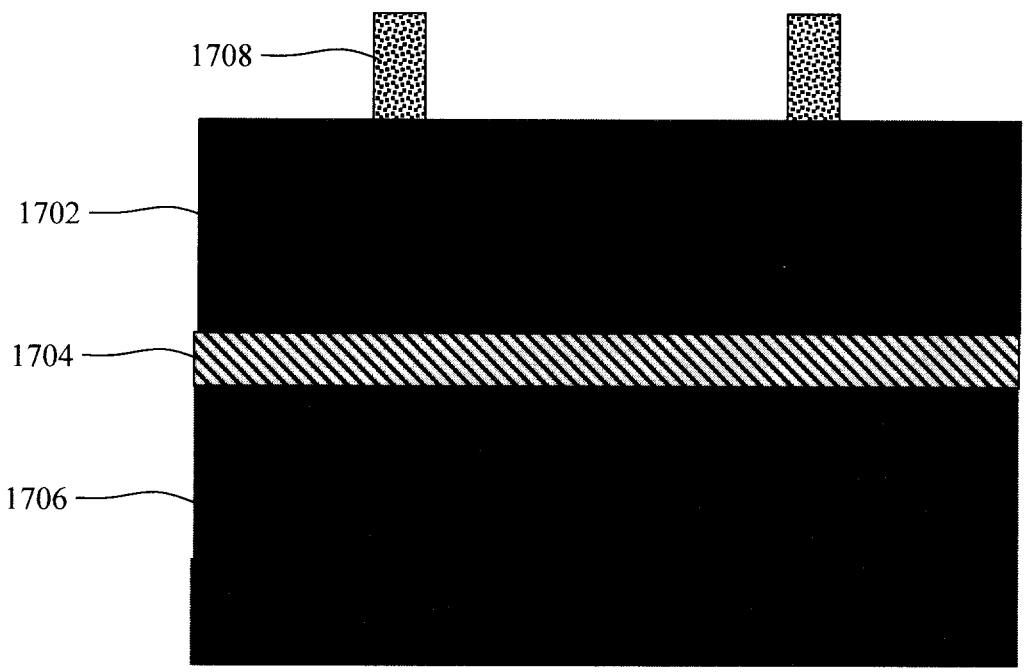
FIG. 17 is a cross-sectional view illustrating semiconductor-on-insulator (SOI) wafer having an SOI layer separated from a substrate by a buried insulator, and fin hardmasks having been formed on the SOI layer according to an embodiment of the present invention.

Referring to FIG. 17, the process begins with a substrate in which at least one fin will be patterned. According to an exemplary embodiment, the substrate is a semiconductor-on-insulator (SOI) wafer. A SOI wafer includes an SOI layer 1702 separated from an underlying substrate 1706 by a buried insulator 1704. When the buried insulator 1704 is an oxide it is also referred to herein as a buried oxide or BOX.

The SOI layer 1702 and the substrate 1706 are each formed from a semiconductor material including, but not limited to, silicon (Si), germanium (Ge), silicon germanium (SiGe), and/or a III-V semiconductor. As will be described in detail below, the SOI layer 1702 and the substrate 1706 will be used to form the vertical fin channels of the stacked VTFET devices. Thus, according to an exemplary embodiment, the SOI layer 1702 and the substrate 1706 are both undoped. Since the stacked VTFET design will include both an NFET and a PFET (stacked in any order), different materials are preferably used for the SOI layer 1702 and the substrate 1706. For instance, the particular material used for the SOI layer 1702 and the substrate 1706 will depend on whether the top VTFET in the stack (formed using the SOI layer 1702) will be an NFET or PFET and whether the bottom VTFET in the stack (formed using the substrate 1706) will be an NFET or a PFET. By way of example only, Si is a preferred channel material for an NFET, while SiGe is a preferred channel material for a PFET.

Standard lithography and etching techniques are used to pattern at least one fin hardmask 1708 on the SOI layer 1702 marking the footprint and location of the fins. Suitable fin hardmask materials include, but are not limited to, nitride materials such as silicon nitride (SiN) and/or silicon oxynitride (SiON).

Figure 18:
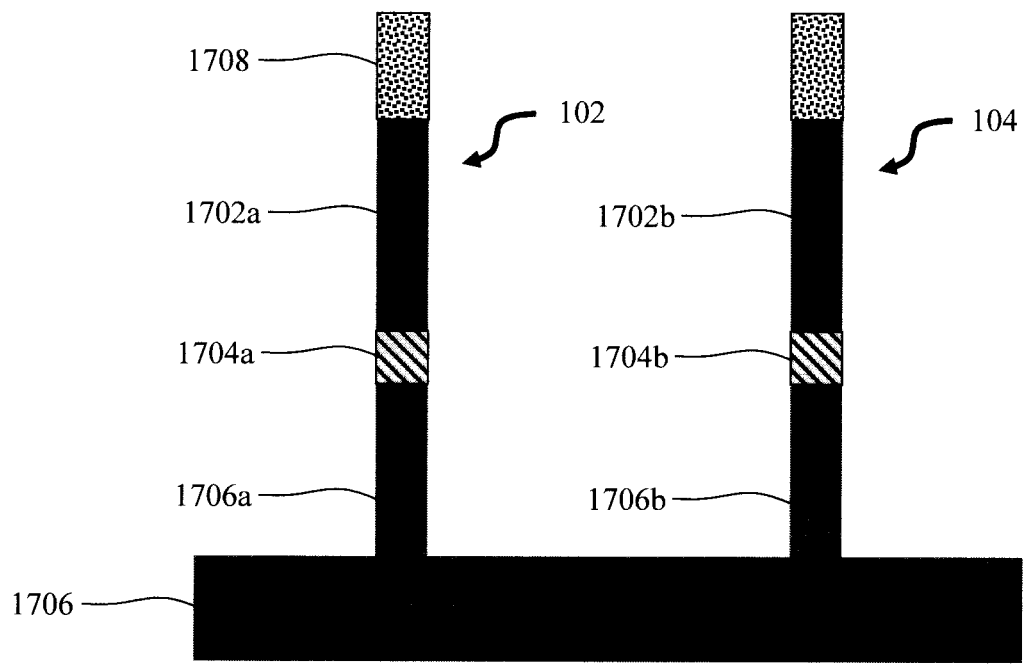
FIG. 18 is a cross-sectional view illustrating the fin hardmasks having been used to pattern fins in the SOI wafer according to an embodiment of the present invention.

As shown in FIG. 18, the fin hardmasks 1708 are then used to pattern at least one fin in the SOI layer 1702, buried insulator 1704 and substrate 1706. For illustrative purposes only, the present example is based on the NAND gate design described in conjunction with the description of FIGS. 1-5 above, and like structures will be numbered alike in the figures. Further, in the present example a first fin 102 and a second fin 104 are patterned at this stage. These are the pair of fins that will serve as the basis for forming the pair of stacked VTFETs of the NAND gate design.

As shown in FIG. 18, each of the fins extends through the SOI layer 1702, through the buried insulator 1704 and partway through the substrate 1706. A directional etching process, such as reactive ion etching (RIE), can be used for the fin etch. Portions of the fins 102/104 patterned in the SOI layer 1702 will now be given the reference numerals 1702a, b, the portions of the fins 102/104 patterned in the buried insulator 1704 will now be given the reference numerals 1704*a,b*, and the portions of the fins 102/104 patterned in the substrate 1706 will now be given the reference numeral 1706*a,b*.

Figure 19:
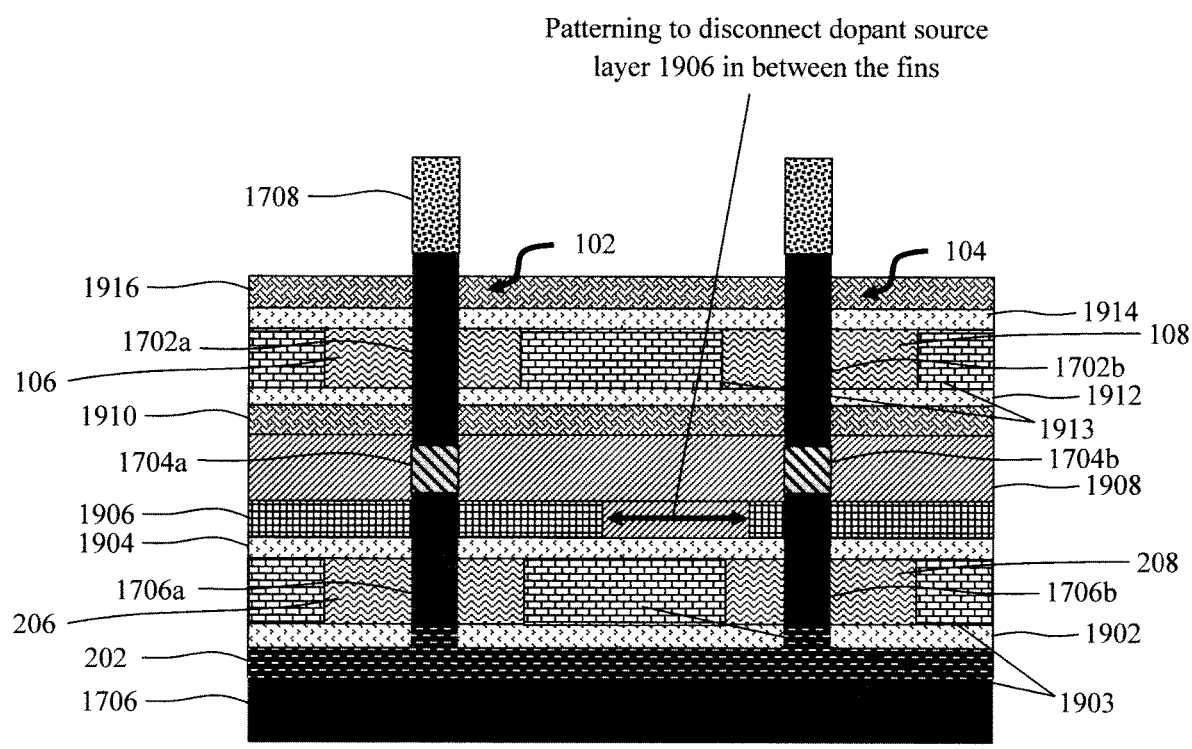
FIG. 19 is a cross-sectional view illustrating bottom source and drains having been formed in the substrate at the base of the fins, bottom spacers of bottom VTFETs having been formed on the bottom source and drains, gates of the bottom VTFETs having been formed above the bottom spacers, top spacers of the bottom VTFETs having been formed above the gates, a dopant source layer of the bottom VTFETs having been deposited onto the top spacers and then patterned, an n-p isolation spacer having been formed above the patterned dopant source layer, a (bottom) dopant source layer of the top VTFETs having been deposited onto the n-p isolation spacer, bottom spacers of the top VTFETs having been formed on the (bottom) dopant source layer, gates of top VTFETs having been formed above the bottom spacers, top spacers of the top VTFETs having been formed above the gates, and a (top) dopant source layer of the top VTFETs having been deposited onto the top spacers to form a device stack according to an embodiment of the present invention.
Figure 20:
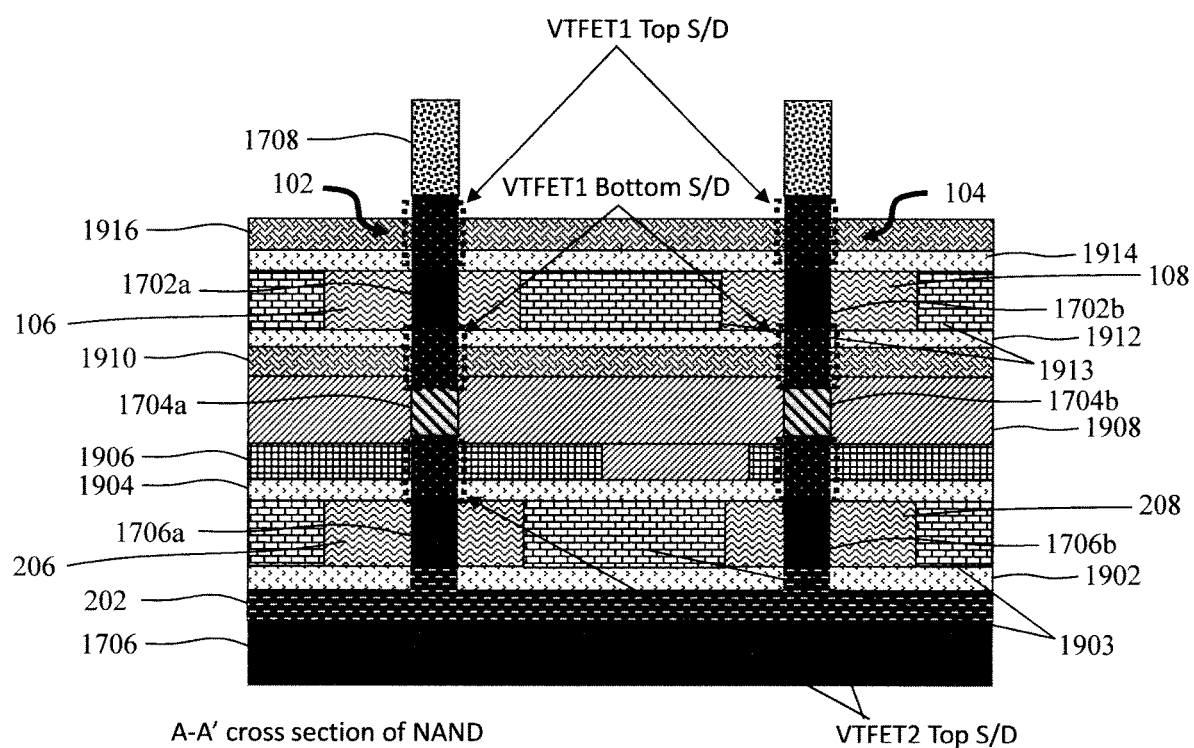
FIG. 20 is a cross-sectional view illustrating a drive-in anneal having been used to drive dopants from the dopant source layers into the fins according to an embodiment of the present invention.
Figure 21:
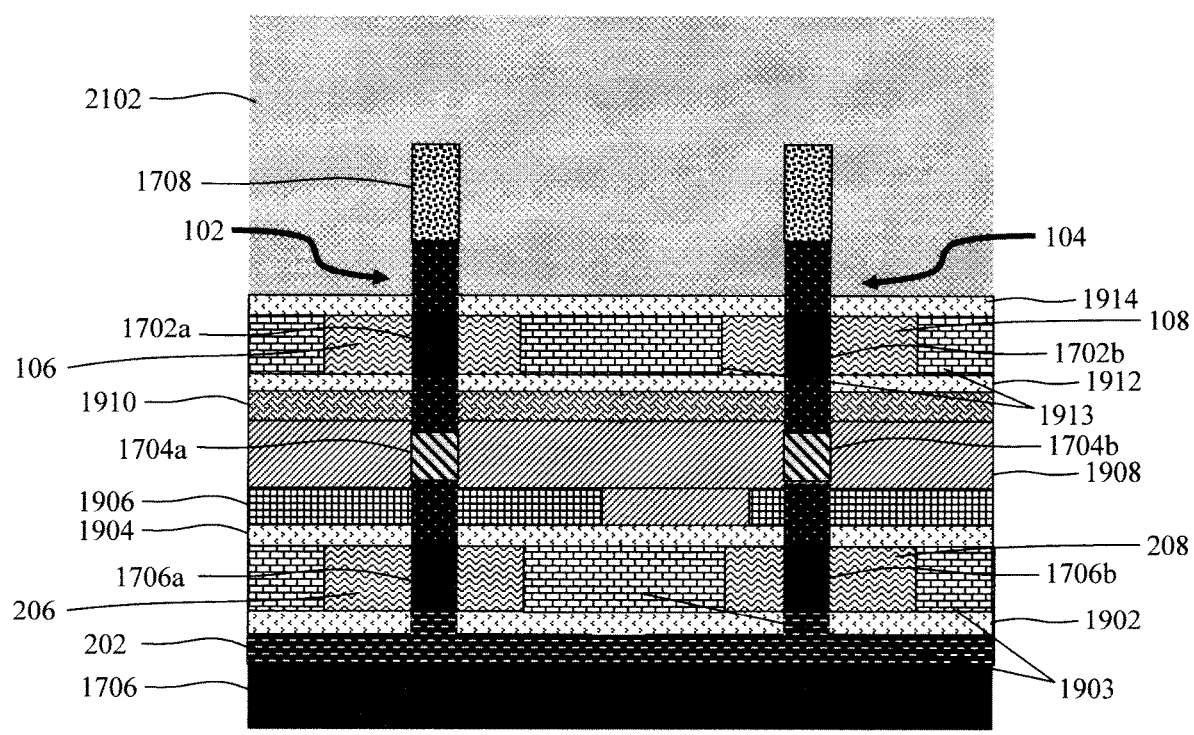
FIG. 21 is a cross-sectional view illustrating an interlayer dielectric (ILD) having been deposited over the fins according to an embodiment of the present invention.

Device stacks are then formed alongside the fins 102 and 104. See FIG. 19. FIG. 19 depicts a cross-sectional cut along line A-A' of the NAND logic gate in FIG. 1 and FIG. 2. Prior to building the device stacks, bottom source and drains 202 are first formed in the substrate 1706 at the base of the fins 102 and 104, which will serve as the bottom source and drains of the bottom VTFETs (i.e., VTFET2A and VTFET2B). See FIG. 19. According to an exemplary embodiment, the bottom source and drains 202 are formed using ion implantation of an n-type or p-type dopant into the substrate 1706 beneath the fins 102 and 104. Suitable n-type dopants include, but are not limited to, phosphorous (P) and/or arsenic (As), and suitable p-type dopants include, but are not limited to, boron (B). The polarity of the dopant (n-type or p-type) for the bottom source and drains 202 varies depending on whether the bottom VTFETs (i.e., VTFET2A and VTFET2B) are NFETs or PFETs. In the case of NFETs, the bottom source and drains 202 include a p-type dopant, whereas in the case of PFETs the bottom source and drains 202 include an n-type dopant.

Next, bottom spacers 1902 of the bottom VTFETs (i.e., VTFET2A and VTFET2B) are formed on the bottom source and drains 202. Suitable materials for the bottom spacers 1902 include, but are not limited to, silicon dioxide ($SiO_2$) and/or silicon oxycarbide (SiOC).

According to an exemplary embodiment, the bottom spacers 1902 are formed using a directional deposition process whereby the spacer material is deposited with a greater amount of the material being deposited on horizontal surfaces (including on top of the bottom source and drains 202), as compared to vertical surfaces (such as along sidewalls of the fins 102 and 104). Thus, when an etch is used on the spacer material, the timing of the etch needed to remove the spacer material from the vertical surfaces will leave the bottom spacers 1902 shown in FIG. 19 on the bottom source and drains 202 since a greater amount of the spacer material was deposited on these (horizontal) surfaces to begin with. By way of example only, a high density plasma (HDP) chemical vapor deposition (CVD) or physical vapor deposition (PVD) process can be used for directional film deposition.

Gates 206 and 208 of the bottom VTFETs (i.e., VTFET2A and VTFET2B, respectively) are next formed alongside the fins 102 and 104 above the bottom spacers 1902. According to an exemplary embodiment, the gates 206 and 208 are each made up of a stack of gate materials. By way of example only, each gate stack includes a gate dielectric deposited onto the fins 102 and 104, and a gate conductor deposited over the gate dielectric.

According to an exemplary embodiment, a metal gate stack is formed wherein the gate conductor is a metal or combination of metals and the gate dielectric is a high-κ dielectric. For instance, the gate conductor is a workfunction setting metal. The particular workfunction setting metal employed can vary depending on whether the bottom VFET is an NFET (n-type workfunction setting metal) or PFET (p-type workfunction setting metal). Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

It is notable that the gates 206 and 208 can be formed for both of the bottom VTFETs (i.e., VTFET2A and VTFET2B) concurrently. Namely, since the bottom VTFETs (i.e., VTFET2A and VTFET2B) are either both NFETs or PFETs, the gates 206 and 208 can be formed from the same materials (i.e., the same gate dielectric and same gate conductor) deposited concurrently alongside fins 102 and 104, respectively. Following formation, the gates 206 and 208 are then patterned (i.e., to separate the gates 206 and 208 of the bottom VTFETs (i.e., VTFET2A and VTFET2B) from one another). The cut in the gates is then filled with a dielectric 1903 (such as silicon dioxide). See FIG. 19.

Top spacers 1904 of the bottom VTFETs (i.e., VTFET2A and VTFET2B) are then formed above the gates 206 and 208. Suitable materials for the top spacers 1904 include, but are not limited to, $SiO_2$ and/or SiOC. In the same manner as described above, the top spacers 1904 can be formed using a directional deposition process, such as HDP CVD or PVD, followed by an etch to remove the material from vertical surfaces resulting in formation of the top spacers 1904 shown in FIG. 19.

A dopant source layer 1906 for the bottom VTFETs (i.e., VTFET2A and VTFET2B) is next deposited onto the top spacers 1904 alongside the fins 102 and 104. According to an exemplary embodiment, the same dopant source layer 1906 is used for both bottom VTFETs (i.e., VTFET2A and VTFET2B). The dopant source layer 1906 will serve as a source for dopants that will be driven into fins 102 and 104 to form the top source and drains of the bottom VTFETs (i.e., VTFET2A and VTFET2B). Further, as provided above, after it serves as a dopant source, layer 1906 will be removed and replaced with a contact material. Thus, the dopant source layer 1906 is also a sacrificial material that serves as a placeholder for source and drain contacts. Use of the dopant source layer in this manner is advantageous because it enables self-aligned source and drain contacts to be formed. Namely, since the source and drains are being placed in the fins 102 and 104 based on the location of the dopant source layer 1906, then it stands to reason that the dopant source layer 1906 is perfectly aligned with the source and drains it is used to form. As such, when the dopant source layer 1906 is removed and replaced with the contact, the contact too will be perfectly aligned to the respective source and drains.

When serving as a dopant source, the particular type of dopant source layer 1906 used depends on whether the bottom VTFETs (i.e., VTFET2A and VTFET2B) are NFETs or PFETs. With NFETs, the top source and drains include a p-type dopant. Conversely, with PFETs the top source and drains include an n-type dopant.

According to an exemplary embodiment, the dopant source layers used in the present process include boron-doped glass (BSG) as a p-type dopant source and phosphorous-doped glass (PSG) an n-type dopant source. As such, if the bottom VTFETs (i.e., VTFET2A and VTFET2B) are NFETs then the dopant source layer 1906 is PSG. Conversely, if the bottom VTFETs (i.e., VTFET2A and VTFET2B) are PFETs then the dopant source layer 1906 is BSG. In the same manner as described above, the dopant source layer 1906 can be deposited using a directional deposition process, such as HDP CVD or PVD, with a greater amount of the material (e.g., PSG or BSG) being deposited onto horizontal surfaces, followed by an etch to remove the material from vertical surfaces resulting in formation of the dopant source layer 1906 shown in FIG. 19.

As provided above, the dopant source layer 1906 also serves as a sacrificial material that is later removed and replaced with a contact metal. As shown in FIG. 19, after deposition, the dopant source layer 1906 is patterned. The notion here is that, in order to selectively serve as the placeholder for a contact to a specific top source and drain, the dopant source layer 1906 needs to be disconnected in between the fins 102 and 104 (e.g., in this case a ground rail 112 will be formed to the top source and drains of the bottom VTFET2A—see FIG. 3, described above). That way, only a select portion of the dopant source layer 1906 at the proper location can be removed and replaced with the contact. Top-down views of the (disconnected) contact will be provided and described below.

It is notable that the portions 1704a and 1704b of the buried insulator 1704 in the fins 102 and 104, respectively, separate the vertical fin channels (portions 1706a and 1706b) of the bottom VTFETs (i.e., VTFET2A and VTFET2B) from the vertical fin channels (portion 1702a and 1702b) of the top VTFETs (i.e., VTFET1A and VTFET1B). As shown in FIG. 19, the dopant source layer 1906 is present alongside the fins 102 and 104 below the portions 1704a and 1704b of the buried insulator 1704. This completes formation of the bottom VTFETs (i.e., VTFET2A and VTFET2B).

An n-p isolation spacer 1908 is formed above the (patterned) dopant source layer 1906 and serves to isolate the bottom VTFETs (i.e., VTFET2A and VTFET2B) from the top VTFETs (i.e., VTFET1A and VTFET1B). The n-p isolation spacer 1908 separates the dopant source layer 1906 of the bottom VTFETs (i.e., VTFET2A and VTFET2B) from a corresponding (bottom) dopant source layer 1910 of the top VTFETs (i.e., VTFET1A and VTFET1B) which also contains an n-type or p-type dopant. Thus, n-p isolation spacer 1908 isolates these n-/p-type dopant source layers from one another. Suitable materials for the n-p isolation spacer 1908 include, but are not limited to, dielectric materials such as SiN and/or SiON.

Formation of the top VTFETs (i.e., VTFET1A and VTFET1B) proceeds in the same general manner as with the bottom VTFETs, except that devices of the opposite polarity are formed, i.e., top NFETs are formed over bottom PFETs, and vice versa. Specifically, as shown in FIG. 19, the (bottom) dopant source layer 1910 of the top VTFETs (i.e., VTFET1A and VTFET1B) is deposited onto the n-p isolation spacer 1908. The dopant source layer 1910 will be used as a dopant source for forming the bottom source and drains of the top VTFETs (i.e., VTFET1A and VTFET1B). Thus, the particular type of dopant source layer 1910 employed will depend on whether the top VTFETs (i.e., VTFET1A and VTFET1B) are NFETs or PFETs. As provided above, with NFETs, the bottom source and drains include a p-type dopant and a suitable dopant source layer 1910 is PSG. Conversely, with PFETs, the bottom source and drains include an n-type dopant and a suitable dopant source layer 1910 is BSG. In the same manner as described above, the dopant source layer 1910 can be deposited using a directional deposition process, such as HDP CVD or PVD, with a greater amount of the material (e.g., PSG or BSG) being deposited onto horizontal surfaces, followed by an etch to remove the material from vertical surfaces resulting in formation of the dopant source layer 1910 shown in FIG. 19.

Bottom spacers 1912 of the top VTFETs (i.e., VTFET1A and VTFET1B) are formed on the dopant source layer 1910. Suitable materials for the bottom spacers 1912 include, but are not limited to, $SiO_2$ and/or SiOC. In the same manner as described above, the bottom spacers 1912 can be deposited using a directional deposition process, such as HDP CVD or PVD, with a greater amount of the spacer material being deposited onto horizontal surfaces, followed by an etch to remove the material from vertical surfaces resulting in formation of the bottom spacers 1912 shown in FIG. 19.

Gates 106 and 108 of the top VTFETs (i.e., VTFET1A and VTFET1B, respectively) are next formed alongside the fins 102 and 104 above the bottom spacers 1912. According to an exemplary embodiment, the gates 106 and 108 are each made up of a stack of gate materials. By way of example only, each gate stack includes a gate dielectric deposited onto the fins 102 and 104, and a gate conductor deposited over the gate dielectric.

According to an exemplary embodiment, a metal gate stack is formed wherein the gate conductor is a metal or combination of metals and the gate dielectric is a high-κ dielectric. For instance, the gate conductor is a workfunction setting metal. The particular workfunction setting metal employed can vary depending on whether the bottom VFET is an NFET (n-type workfunction setting metal) or PFET (p-type workfunction setting metal). As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W. Suitable high-κ gate dielectrics include, but are not limited to, $HfO_2$ and/or $La_2O_3$.

It is notable that the gates 106 and 108 can be formed for both of the top VTFETs (i.e., VTFET1A and VTFET1B) concurrently. Namely, since the top VTFETs (i.e., VTFET1A and VTFET1B) are either both NFETs or PFETs, the gates 106 and 108 can be formed from the same materials (i.e., the same gate dielectric and same gate conductor) deposited concurrently alongside fins 102 and 104, respectively. Following formation, the gates 106 and 108 are then patterned (i.e., to separate the gates 106 and 108 of the top VTFETs (i.e., VTFET1A and VTFET1B) from one another). The cut in the gates is then filled with a dielectric 1913 (such as silicon dioxide). See FIG. 19.

Top spacers 1914 of the top VTFETs (i.e., VTFET1A and VTFET1B) are formed above the gates 106 and 108. Suitable materials for the top spacers 1914 include, but are not limited to, $SiO_2$ and/or SiOC. In the same manner as described above, the top spacers 1914 can be deposited using a directional deposition process, such as HDP CVD or PVD, with a greater amount of the spacer material being deposited onto horizontal surfaces, followed by an etch to remove the material from vertical surfaces resulting in formation of the top spacers 1914 shown in FIG. 19.

To complete the stack, a (top) dopant source layer 1916 of the top VTFETs (i.e., VTFET1A and VTFET1B) is deposited onto the top spacers 1914. The dopant source layer 1916 will be used as a dopant source when forming the top source and drains of the top VTFETs (i.e., VTFET1A and VTFET1B). Thus, the particular type of dopant source layer 1916 used depends on whether the top VTFETs are NFETs or PFETs. As provided above, with NFETs, the top source and drains include a p-type dopant and a suitable dopant source layer 1916 is PSG. Conversely, with PFETs, the top source and drains include an n-type dopant and a suitable dopant source layer 1916 is BSG. In the same manner as described above, the dopant source layer 1916 can be deposited using a directional deposition process, such as HDP CVD or PVD, with a greater amount of the material (e.g., PSG or BSG) being deposited onto horizontal surfaces, followed by an etch to remove the material from vertical surfaces resulting in formation of the dopant source layer 1916 shown in FIG. 19.

A drive-in anneal is then used to drive dopants from the dopant source layers 1906 and 1910/1916 into the fins 102 and 104 above and below the vertical fin channel (portions 1702a,b and 1706a,b) of the bottom and top VTFETs (i.e., VTFET2A and VTFET2B/VTFET1A and VTFET1B, respectively). This dopant drive-in anneal will form the top source and drains (VTFET2 top S/D) of the bottom VTFETs (i.e., VTFET2A and VTFET2B), the bottom source and drains (VTFET1 bottom S/D) of the top VTFETs (i.e., VTFET1A and VTFET1B), and the top source and drains (VTFET1 top S/D) of the top VTFETs (i.e., VTFET1A and VTFET1B). See FIG. 20. In order to enable further processing, following the drive-in anneal the dopant source layer 1916 is then removed from the top VTFETs (i.e., VTFET1A and VTFET1B).

An interlayer dielectric (ILD) 2102 is then deposited over the fins 102 and 104. See FIG. 21. Suitable ILD materials include, but are not limited to, SiO$_2$, organic planarizing (OPL) materials, etc.

Figure 22:
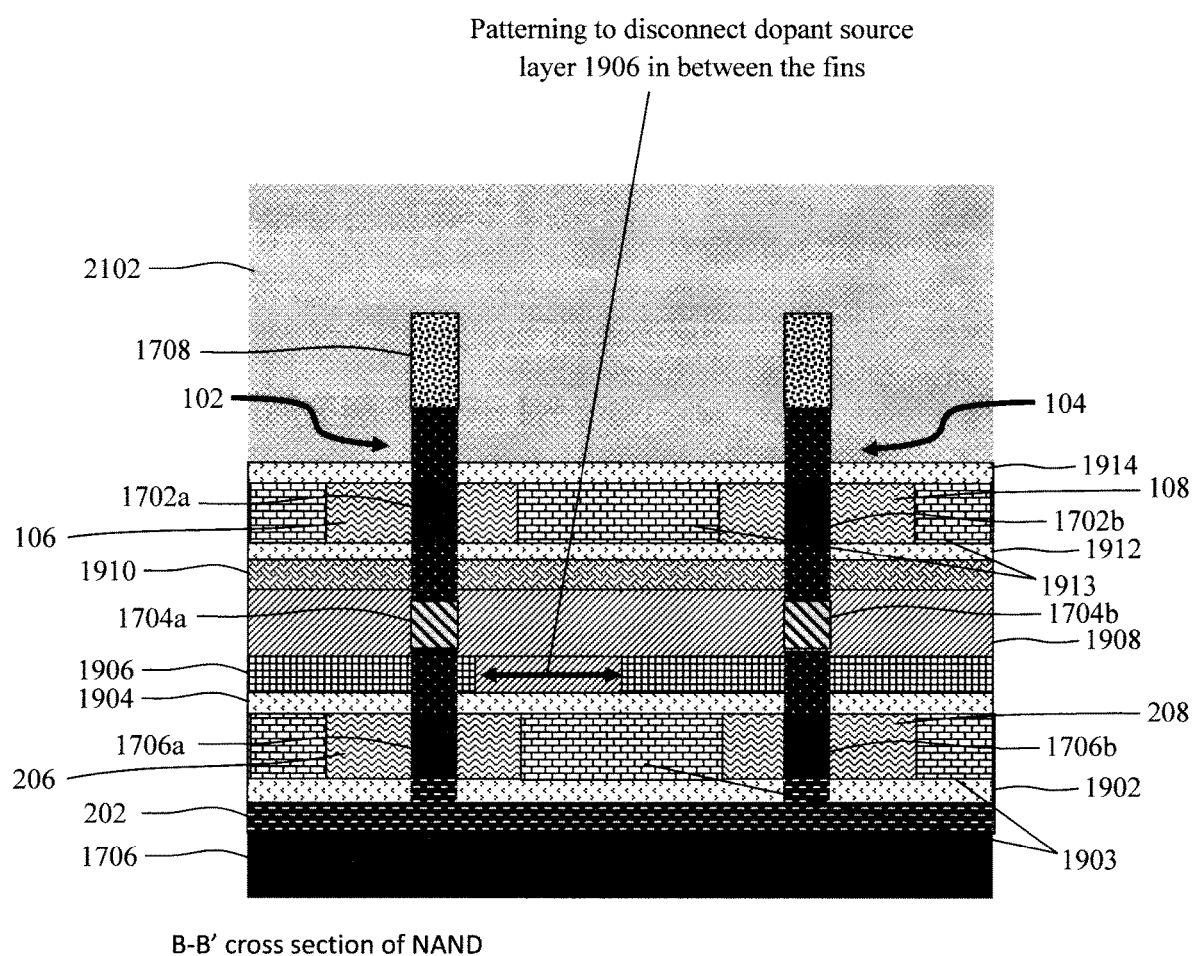
FIG. 22 is a cross-sectional view of a different cut through the logic gate according to an embodiment of the present invention.

FIG. 22 depicts a different cross-sectional cut along line B-B' of the NAND logic gate in FIG. 1 and FIG. 2. From this perspective, it can be seen that the patterned dopant source layer 1906 is disconnected at a different location (compare FIG. 22 with FIG. 19) when viewed in this cross-section. Namely, referring back to FIG. 3 and FIG. 19 (both cross-sectional cuts along line A-A' of the NAND logic gate in FIG. 1 and FIG. 2) the ground contact 112 is formed in contact with the top source and drains (VTFET2 top S/D) of the bottom VTFET2A. By comparison, referring back to FIG. 4 and FIG. 22 (both cross-sectional cuts along line B-B' of the NAND logic gate in FIG. 1 and FIG. 2) the output contact 114 is formed in contact with the top source and drains (VTFET2 top S/D) of the bottom VTFET2B, and the bottom source and drains (VTFET1 bottom S/D) of both the top VTFET1A and VTFET1B. By disconnecting the patterned dopant source layer 1906 in between the fins 102 and 104 in the manner shown in FIG. 19 and FIG. 22, the same dopant source layer 1906 can be used to form both of these contacts (ground contact 112 and output contact 114).

Figure 23:
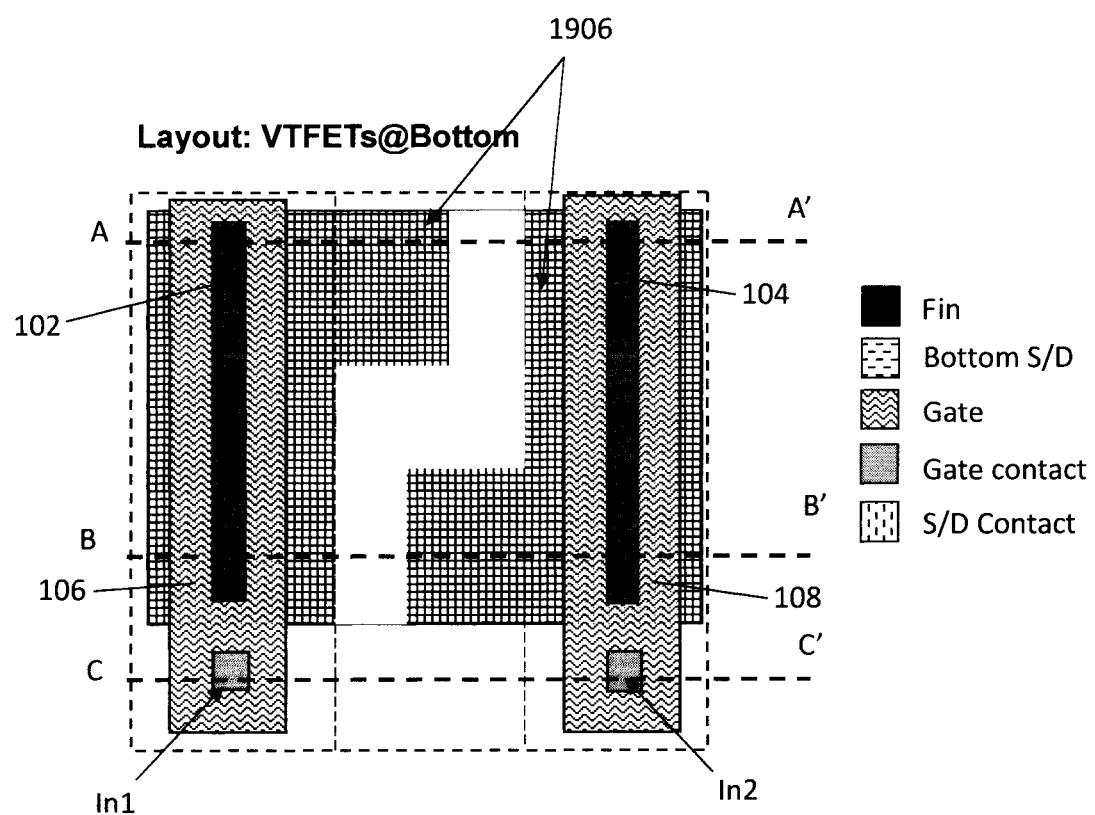
FIG. 23 is a top-down view illustrating an exemplary configuration of a dopant source layer (of the bottom VTFETs) that is disconnected between the fins according to an embodiment of the present invention.

For instance, a top-down view of the (patterned) dopant source layer 1906 of the NAND logic gate of FIG. 1 and FIG. 2 is shown in FIG. 23. FIG. 23 depicts one possible configuration of the patterned dopant source layer 1906 in between the fins 102 and 104. In this example, dopant source layer 1906 is disconnected in between the fins 102 and 104 in a zigzag pattern whereby each portion of the dopant source layer 1906 has an L-shaped pattern. Thus, when the dopant source layer 1906 is removed and replaced with a contact metal (see below), the ground contact 112 and output contact 114 can be formed in their respective locations.

Figure 24:
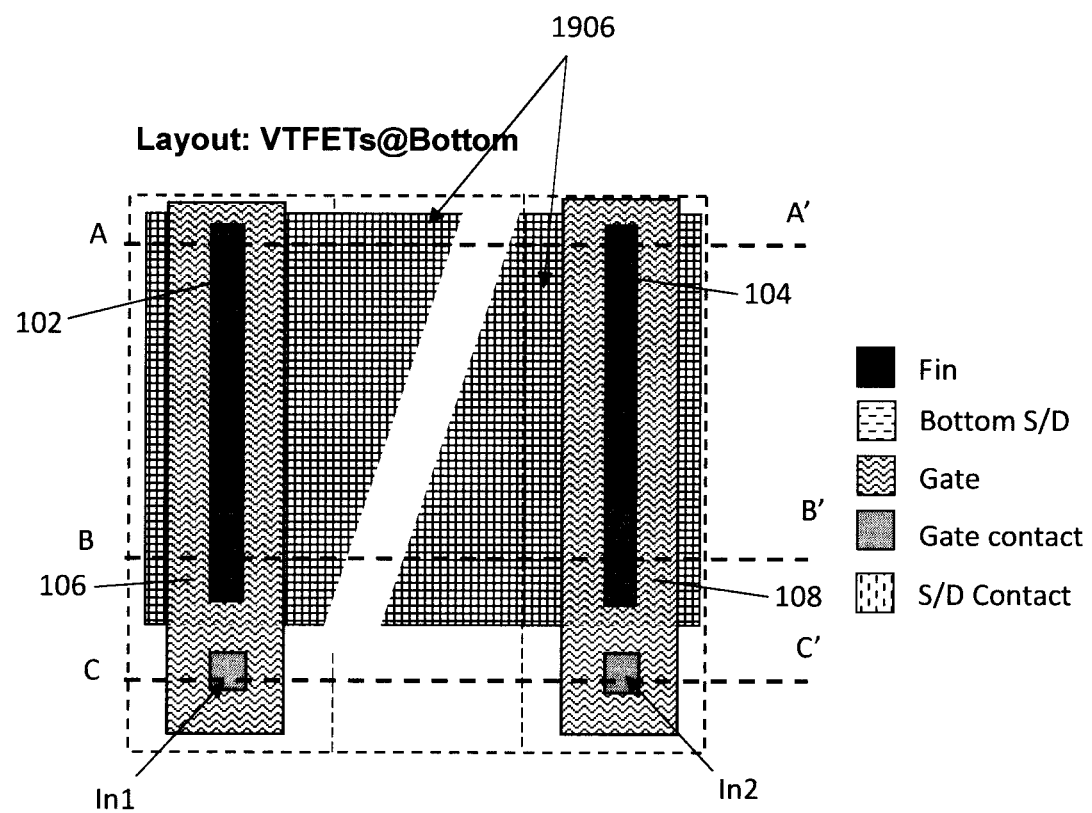
FIG. 24 is a top-down view illustrating another exemplary configuration of the dopant source layer that is disconnected between the fins according to an embodiment of the present invention.

An alternative top-down view of the (patterned) dopant source layer 1906 of the NAND logic gate of FIG. 1 and FIG. 2 is shown in FIG. 24. FIG. 24 depicts another possible configuration of the patterned dopant source layer 1906 in between the fins 102 and 104. In this example, an angled cut is used to disconnect the dopant source layer 1906 in between the fins 102 and 104. Thus, when the dopant source layer 1906 is removed and replaced with a contact metal (see below), the ground contact 112 and output contact 114 can be formed in their respective locations.

The process then proceeds to remove the doped source layer 1906 and replace it with a contact metal(s) to form the ground contact 112 and output contact 114 shown in FIG. 3 and FIG. 4, respectively. It is notable that, in the figures that follow, the process appears the same whether the doped source layer 1906 is disconnected between the fins 102 and 104 in the manner shown in FIG. 23 or in the manner shown in FIG. 24.

Figure 25:
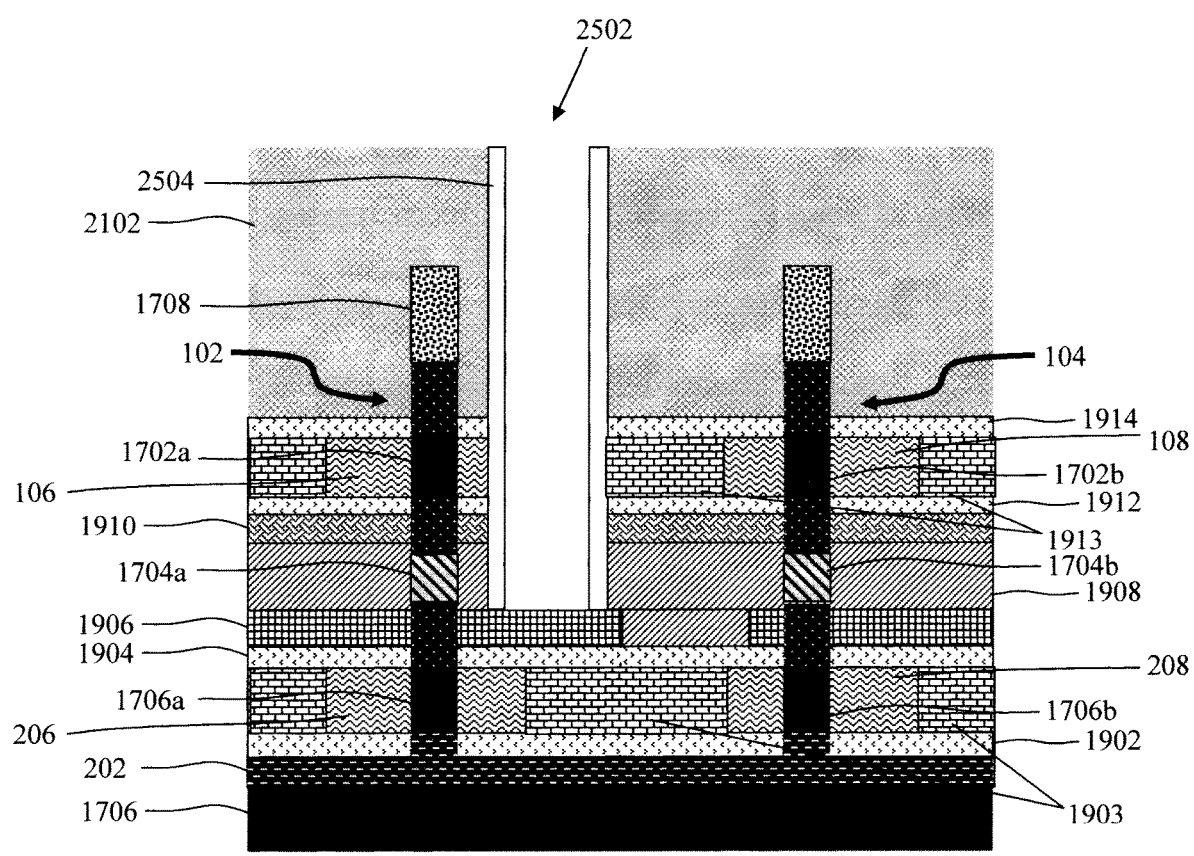
FIG. 25 is a cross-sectional view illustrating a contact trench having been patterned through the device stack down to the dopant source layer (of the bottom VTFETs), and sidewall spacers having been formed along inner sidewalls of the contact trench according to an embodiment of the present invention.
Figure 26:
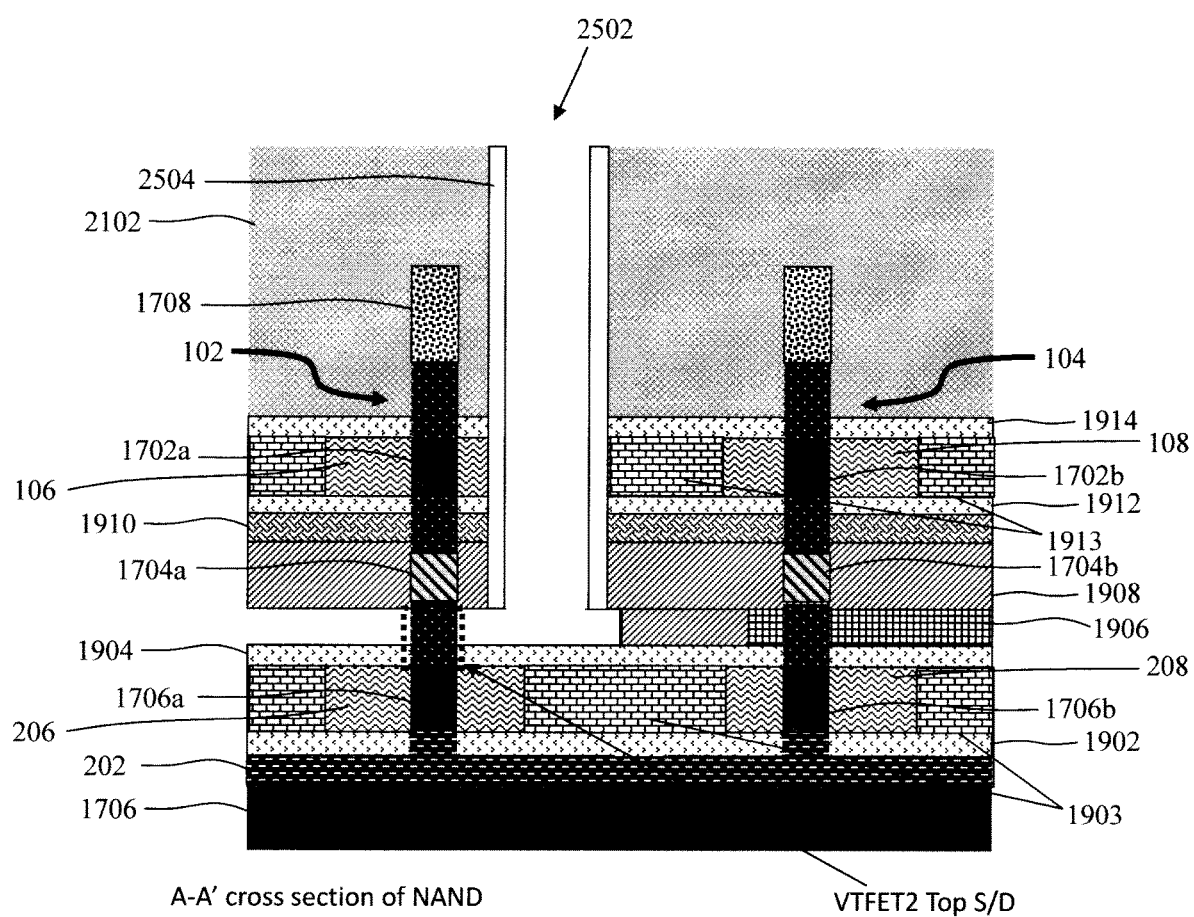
FIG. 26 is a cross-sectional view illustrating the dopant source layer (of the bottom VTFETs) exposed via the contact trench having been removed according to an embodiment of the present invention.

For instance, as shown in FIG. 25 standard lithography and etching techniques are used to pattern a contact trench 2502 extending down through the ILD 2102, top spacers 1914, the gate 106, bottom spacers 1912, dopant source layer 1910, and the n-p isolation spacer 1908, stopping on the dopant source layer 1906. According to an exemplary embodiment, a directional etching process such as reactive ion etching (RIE) is used for the trench etch.

Sidewall spacers 2504 are then formed along the inner sidewalls of the contact trench 2502. Sidewall spacers 2504 serve to isolate the gate 106 from the (ground contact 112) contact to be formed in the contact trench 2502. Suitable materials for the sidewall spacers 2504 include, but are not limited to, nitride spacer materials such as silicon nitride (SiN) and/or silicon oxynitride (SiON).

An isotropic etching process (such as a wet etch) is then used to remove the dopant source layer 1906 which provides access to the top source and drain (VTFET2 top S/D) through the contact trench 2502. See FIG. 26. Notably, because the dopant source layer 1906 was patterned into two different portions prior to deposition of the n-p isolation spacer 1908, only a (first) portion of the dopant source layer 1906 exposed through the contact trench 2502 will be removed at this stage. As provided below, subsequent removal of the other (second) portion of the dopant source layer 1906 (through a second contact trench) can be used to form an output contact 114.

Figure 27:
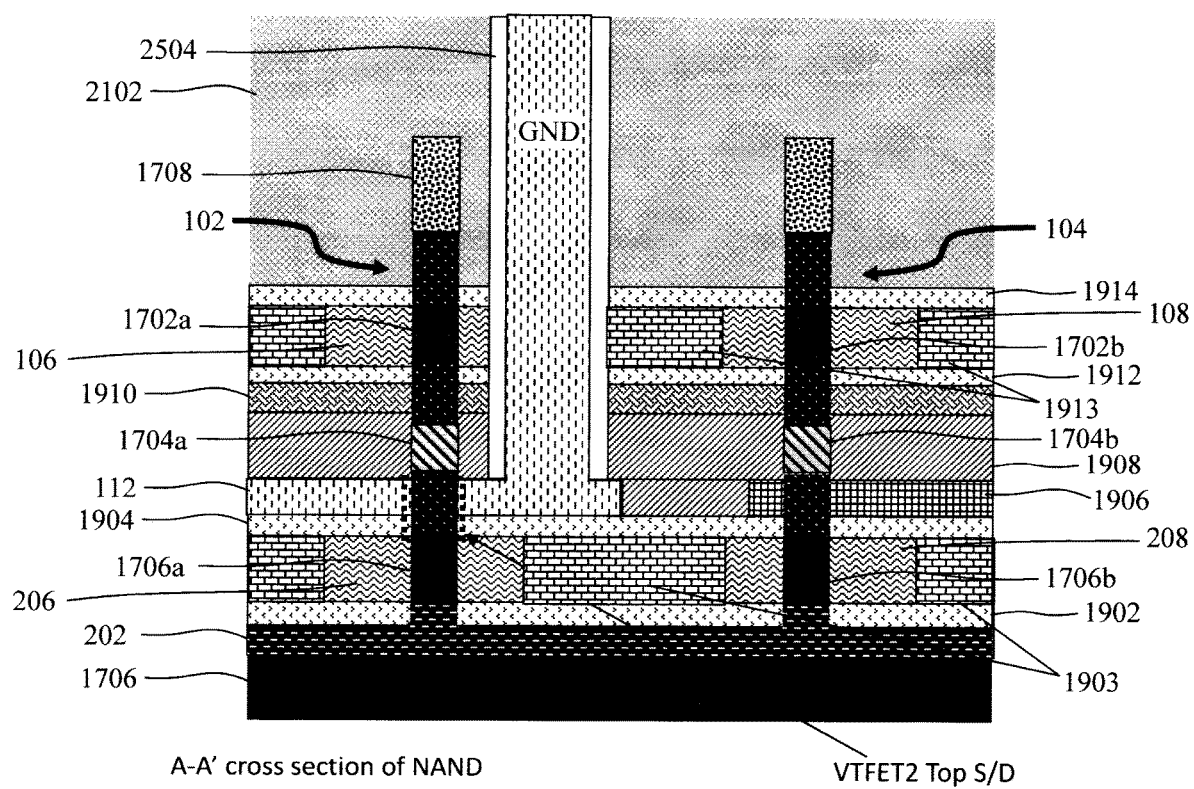
FIG. 27 is a cross-sectional view illustrating the dopant source layer (of the bottom VTFETs) having been replaced with a contact metal that also fills the contact trench according to an embodiment of the present invention.

As shown in FIG. 27, the dopant source layer 1906 is then replaced with a contact metal that also fills the contact trench 2502, forming the ground contact 112 in contact with the top source and drain of the bottom VTFET2A (VTFET2 top S/D). Suitable contact metals include, but are not limited to, copper (Cu), nickel (Ni), titanium (Ti), platinum (Pt) and/or tungsten (W).

Figure 28:
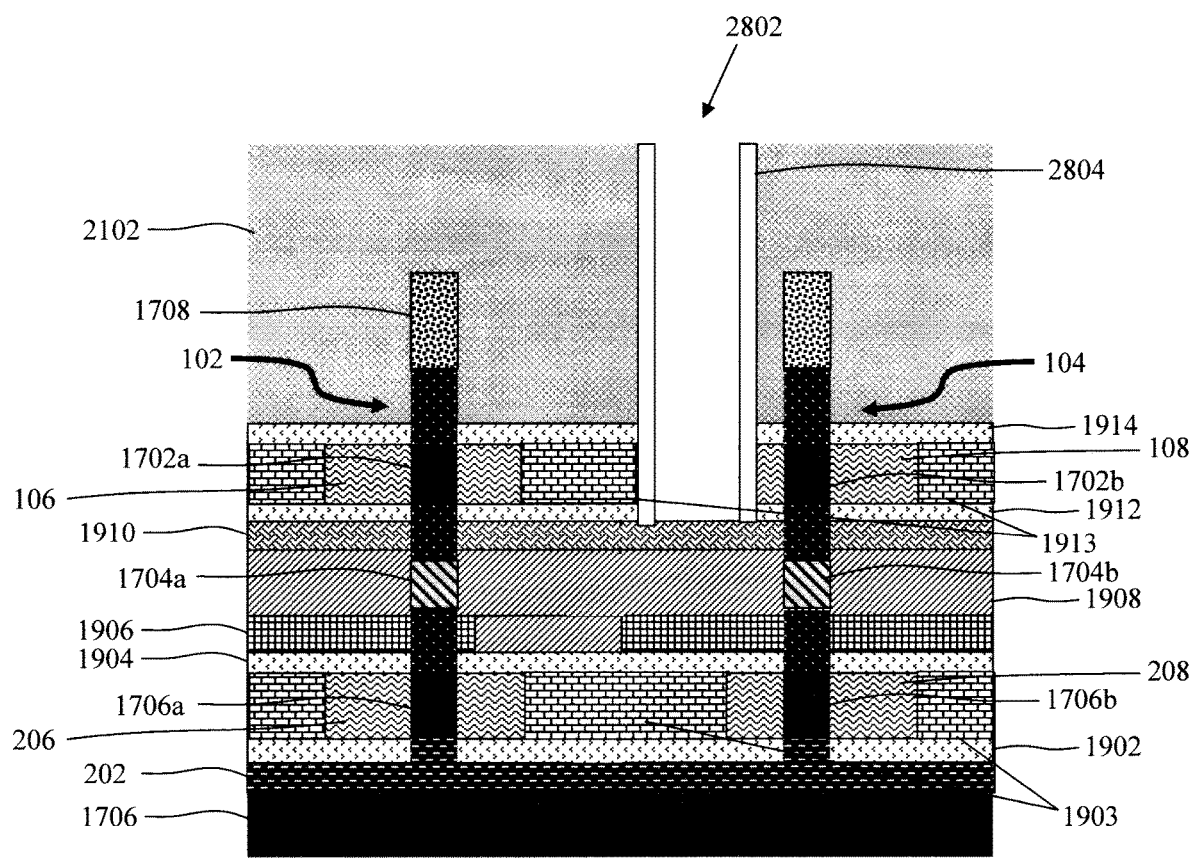
FIG. 28 is a cross-sectional view illustrating a contact trench having been patterned through the device stack down to the (bottom) dopant source layer of the top VTFETs, and sidewall spacers having been formed along inner sidewalls of the contact trench according to an embodiment of the present invention.
Figure 29:
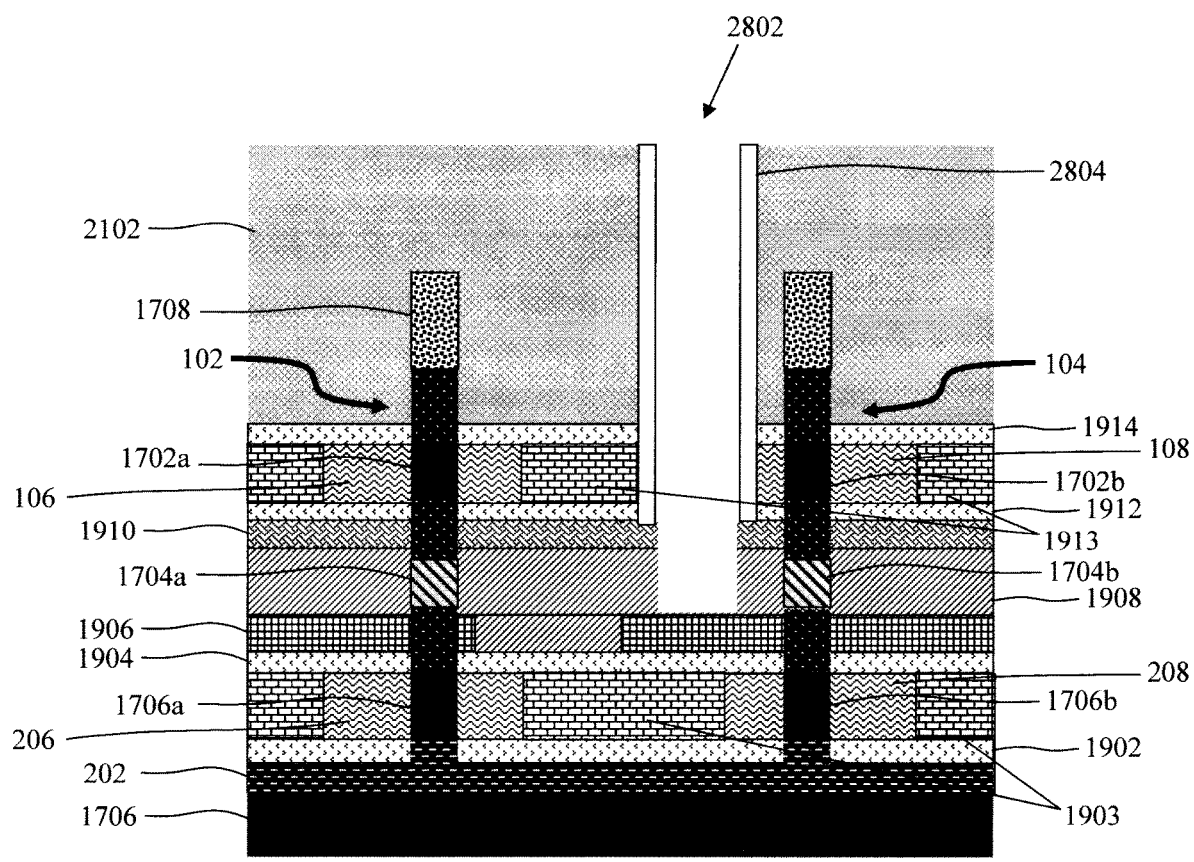
FIG. 29 is a cross-sectional view illustrating the contact trench having been extended down to the dopant source layer (of the bottom VTFETs) according to an embodiment of the present invention.
Figure 30:
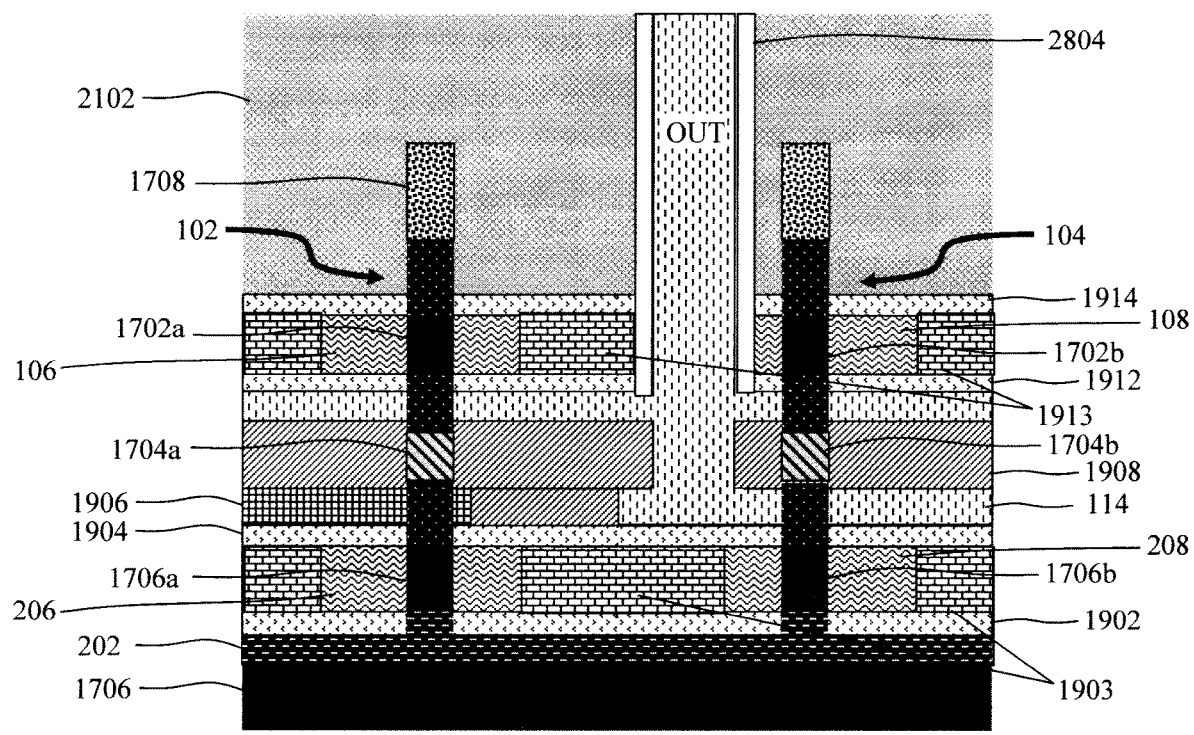
FIG. 30 is a cross-sectional view illustrating the (bottom) dopant source layer of the top VTFETs and the dopant source layer (of the bottom VTFETs) having been replaced with a contact metal that also fills the contact trench according to an embodiment of the present invention.

The same process flow can be used to form the output contact 114 in contact with the top source and drains (VTFET2 top S/D) of the bottom VTFET2B, the bottom source and drains (VTFET1 bottom S/D) of both the top VTFET1A and VTFET1B, except in that case the dopant source layer 1910 and the remaining (second) portion of the dopant source layer 1906 will be removed and replaced to form the contact. As shown in FIG. 28, a contact trench 2802 is patterned extending down through the ILD 2102, top spacers 1914, the gate 108, bottom spacers 1912, stopping on the dopant source layer 1910. In the same manner as described above, sidewall spacers 2804 are then formed along the inner sidewalls of the contact trench 2802 to isolate the gate 108 from the (ground contact 114) contact to be formed in the contact trench 2802. The contact trench 2802 is then extended through the dopant source layer 1910, the n-p isolation spacer 1908, stopping on the dopant source layer 1906. See FIG. 29. The reason a two-step trench etch is needed is to permit the sidewall spacers 2804 to be placed lining the contact trench 2802 and covering the gate 108, without also covering dopant source layer 1910. Specifically, if the trench had been patterned in a single step down to the dopant source layer 1906, followed by placement of the sidewall spacers 2804, then the sidewall spacers 2804 would cover the dopant source layer 1910 preventing its removal.

An isotropic etching process (such as a wet etch) is then used to remove the remaining (second) portion of the dopant source layer 1906 along with the dopant source layer 1910 which provides access to the top source and drains (VTFET2 top S/D) of the bottom VTFET2B, the bottom source and drains (VTFET1 bottom S/D) of both the top VTFET1A and VTFET1B through the contact trench 2802. The dopant source layers 1906 and 1910 are then replaced with a contact metal that also fills the contact trench 2802, forming the output contact 114 in contact with the top source and drains (VTFET2 top S/D) of the bottom VTFET2B, the bottom source and drains (VTFET1 bottom S/D) of both the top VTFET1A and VTFET1B. See FIG. 30.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A logic gate device, comprising:
   at least one top vertical transport field-effect transistor (VTFET1) sharing a fin with at least one bottom VTFET (VTFET2);
   a power rail connected to a power contact of the logic gate device; and
   a ground rail, adjacent to the power rail, connected to a ground contact of the logic gate device,
   wherein the VTFET1 comprises a first top VTFET (VTFET1A) and a second top VTFET (VTFET1B), and the VTFET2 comprises a first bottom VTFET (VTFET2A) and a second bottom VTFET (VTFET2B), wherein the VTFET1A and the VTFET2A share a first fin, and the VTFET and the VTFET2B share a second fin, and wherein the ground contact is connected to top source and drains of the VTFET2A.

2. The logic gate device of claim 1, wherein the VTFET1 is an n-channel FET (NFET) and the VTFET2 is a p-channel FET (PFET).

3. The logic gate device of claim 1, wherein the VTFET1 is a PFET and the VTFET2 is an NFET.

4. The logic gate device of claim 1, wherein the VTFET1 and the VTFET2 each comprises a gate alongside the fin.

5. The logic gate device of claim 1, further comprising:
   an output contact connected to i) bottom source and drains of the VTFET1A and the VTFET1B, and ii) top source and drains of the VTFET2B.

6. A logic gate device, comprising:
   at least one top vertical transport field-effect transistor (VTFET1) sharing a fin with at least one bottom VTFET (VTFET2), wherein the VTFET1 is either a) an NFET if the VTFET2 is a PFET or b) a PFET if the VTFET2 is an NFET;
   a power rail connected to a power contact of the logic gate device; and
   a ground rail, adjacent to the power rail, connected to a ground contact of the logic gate device,
   wherein the VTFET1 comprises a first top VTFET (VTFET1A) and a second top VTFET (VTFET1B), and the VTFET2 comprises a first bottom VTFET (VTFET2A) and a second bottom VTFET (VTFET2B), wherein the VTFET1A and the VTFET2A share a first fin, and the VTFET1B and the VTFET2B share a second fin, and wherein the ground contact is connected to top source and drains of the VTFET2A.

7. The logic gate device of claim 6, wherein the VTFET1 and the VTFET2 each comprises a gate alongside the fin.

8. The logic gate device of claim 6, further comprising:
   an output contact connected to i) bottom source and drains of the VTFET1A and the VTFET1B, and ii) top source and drains of the VTFET2B.

9. A logic gate device, comprising:
   at least one top vertical transport field-effect transistor (VTFET1) sharing a fin with at least one bottom VTFET (VTFET2);
   a power rail connected to a power contact of the logic gate device; and
   a ground rail, adjacent to the power rail, connected to a ground contact of the logic gate device, wherein the VTFET1 comprises a first top VTFET (VTFET1A') and a second top VTFET (VTFET1B'), and the VTFET2 comprises a first bottom VTFET (VTFET2A') and a second bottom VTFET (VTFET2B'), wherein the VTFET1A' and the VTFET2A' share a first fin, and the VTFET1B' and the VTFET2B' share a second fin, and wherein the ground contact is connected to bottom source and drains of the VTFET2A' and the VTFET2B'.

10. The logic gate device of claim 9, further comprising:
    an output contact connected to i) top source and drains of the VTFET1B', and ii) top source and drains of the VTFET2A' and the VTFET2B'.

11. The logic gate device of claim 9, wherein the power contact is connected to i) bottom source and drains of the VTFET1A' and the VTFET1B', and ii) top source and drains of the VTFET1A'.

* * * * *